(12) United States Patent
West et al.

(10) Patent No.: US 10,169,262 B2
(45) Date of Patent: Jan. 1, 2019

(54) LOW-POWER CLOCKING FOR A HIGH-SPEED MEMORY INTERFACE

(71) Applicant: QUALCOMM Incorporated, San Diego, CA (US)

(72) Inventors: David West, San Diego, CA (US); Vaishnav Srinivas, San Diego, CA (US); Michael Brunolli, Escondido, CA (US); Jungwon Suh, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 307 days.

(21) Appl. No.: 15/204,755

(22) Filed: Jul. 7, 2016

(65) Prior Publication Data

US 2017/0017587 A1    Jan. 19, 2017

Related U.S. Application Data

(60) Provisional application No. 62/192,235, filed on Jul. 14, 2015.

(51) Int. Cl.
*G06F 13/00* (2006.01)
*G06F 13/16* (2006.01)
(Continued)

(52) U.S. Cl.
CPC ...... *G06F 13/1689* (2013.01); *G06F 13/4068* (2013.01); *G11C 7/222* (2013.01);
(Continued)

(58) Field of Classification Search
CPC .............................. G06F 13/1689; G11C 7/222
See application file for complete search history.

(56) References Cited

U.S. PATENT DOCUMENTS 7,934,109 B2    4/2011    Macri et al.
8,068,150 B2   11/2011    Koganezawa et al.
(Continued)

FOREIGN PATENT DOCUMENTS

WO    WO-2012021380 A2    2/2012

OTHER PUBLICATIONS

Qimonda GDDR5—White Paper, Aug. 2007, pp. 1-10.
International Search Report and Written Opinion—PCT/US2016/041652—ISA/EPO—dated Oct. 11, 2016.

*Primary Examiner* — Zachary K Huson
(74) *Attorney, Agent, or Firm* — Loza & Loza, LLP

(57) ABSTRACT

Methods, apparatus, and system for use in adaptive communication interfaces are disclosed. An adaptive communication interface is provided, in which a high-speed clock provided in a high-speed mode of operation is suppressed in a low-power mode of operation. In the low-power mode of operation, a low-speed command clock is used for data transfers between a memory device and a system-on-chip, applications processor or other device. A method for operating the adaptive communication interface may include using a first clock signal to control transmissions of commands to a memory device over a command bus. In a first mode of operation, the first clock signal controls data transmissions over the adaptive communication interface. In a second mode of operation, the second clock signal controls data transmissions over the adaptive communication interface. The frequency of the second clock signal may be greater than the frequency of the first clock signal.

30 Claims, 19 Drawing Sheets

(51) Int. Cl.
*G06F 13/40* (2006.01)
*G11C 7/22* (2006.01)
*H03L 7/08* (2006.01)

(52) U.S. Cl.
CPC .... *H03L 7/0807* (2013.01); *G06F 2213/0038* (2013.01); *Y02D 10/14* (2018.01); *Y02D 10/151* (2018.01)

(56) References Cited

U.S. PATENT DOCUMENTS

| | | |
|---|---|---|
| 8,693,603 B2 | 4/2014 | Kim et al. |
| 9,304,579 B2 | 4/2016 | Ware et al. |
| 2003/0126377 A1 | 7/2003 | Orenstien et al. |
| 2010/0067314 A1* | 3/2010 | Ware .................. G06F 13/1689 365/189.15 |
| 2010/0309744 A1 | 12/2010 | Park |
| 2013/0083611 A1* | 4/2013 | Ware .................. G11C 11/4072 365/191 |

* cited by examiner

LOW-POWER CLOCKING FOR A HIGH-SPEED MEMORY INTERFACE

CROSS-REFERENCE TO RELATED APPLICATIONS

This application claims the benefit of U.S. Provisional Application Ser. No. 62/192,235 filed in the U.S. Patent Office on Jul. 14, 2015, the entire content of which being incorporated herein by reference and for all applicable purposes.

TECHNICAL FIELD

The present disclosure relates generally to clock generation circuits for high-speed integrated circuit devices, and more particularly, to providing low-power clocking in high-speed memory devices.

BACKGROUND

Manufacturers of memory devices used in processing circuits and provided in graphics memory cards and users of such memory devices experience a continuous increase in demand for memory density and speed. The manufacturers and system on chip (SoC) vendors may respond by increasing the operating frequency of memory systems. For example, there is continuous pressure to increase the operating frequency of double data rate (DDR) synchronous dynamic random access memory (SDRAM). For example, the nominal operating frequency of fourth generation low-power DDR (LPDDR4) of 4.2 gigabits per second (Bbps) may be insufficient to meet evolving application demands. There is also continuous pressure on designers to decrease power consumption while maintaining or increasing data rates associated with memory devices used in mobile communication devices, for example, in order to decrease battery drain through reduced power consumption.

By way of example of high-speed memory, the JEDEC Solid State Technology Association, or the Joint Electron Device Engineering Council (JEDEC) has specified the graphics double data rate type 5 (GDDR5) standard to provide a high-speed interface for LPDDR4 and other highs speed memory devices and arrays, including graphics cards and the like. Memory devices conforming to the GDDR5 standard can transfer to 32-bit wide data words per write clock (WCK). In order to accomplish the specified throughput, a memory device may perform a 256 bit wide write or read access within two clock cycles at the internal memory core. Such memory device may transfer eight corresponding 32-bit wide words at the I/O pins over a series of half WCK clock cycles.

The use of a WCK clocking scheme to meet higher speeds may increase the number of pins required for I/O and the power consumed when toggling the WCK. In some implementations, jitter and phase offsets may be addressed using an error detection and correction (EDC) signal, and a data bus inversion signal that provides timing information can be used to control signaling related to a corresponding byte of data transmitted on the memory bus, thereby increasing the pin requirement and power consumption further.

SUMMARY

Certain aspects disclosed herein relate to an adaptive communication interface that can provide a high-speed mode of operation and a low-power mode of operation, among other modes, in the adaptive communication interface, a high-speed clock provided in a high-speed mode of operation is suppressed in a low-power mode of operation. In the low-power mode of operation, a low-speed command clock is used for data transfers between a memory device and an SoC, applications processor or other device.

In an aspect of the disclosure, a method for operating a communication interface coupling a memory device and to memory controller includes transmitting a first clock signal having a first frequency to the memory device, and using the first clock signal to control transmissions of commands to the memory device over a command bus of the communication interface. In a first mode of operation, the first clock signal is used to control transmissions of first data over a data bus of the communication interface. In a second mode of operation, a second clock signal having a second frequency greater than the first frequency is transmitted to the memory device, and the second clock signal may be used to control transmissions of second data over the data bus. The second clock signal may be suppressed in the first mode of operation.

In some aspects, the first and second clock signals are provided by the memory controller. In some transactions on the communication interface, the first data may be transmitted by the memory controller to the memory device. In other transactions on the communication interface, the first data is transmitted by the memory device to the memory controller. In one example, the memory controller is embodied in an application processor. In another example, the memory controller is embodied in a SoC device. The memory controller may include a clock and data recovery (CDR) circuit that provides a sampling clock based in part on transitions of signaling state on the data bus. The memory device may include logic configured to provide transitions in signaling state on the data bus when two or more bytes of data read from the memory device are identical.

In one aspect, the method includes generating a low-speed clock signal, and phase-shifting the low-speed clock signal based on training information to obtain the first clock signal. The second frequency is at least double the first frequency. In some instances, the first frequency is no more than a quarter of the second frequency.

In some aspects, the method includes generating a high-speed clock signal in the second mode of operation, applying a first delay to the high-speed clock signal to obtain a high-speed read clock signal, applying a second delay to the high-speed clock signal to obtain a high-speed write clock signal. The first delay and the second delay may be configured based on training information. The method may further include selecting the high-speed read clock signal for transmission to the memory device as the second clock signal during memory read operations in the second mode of operation, and selecting the high-speed write clock signal for transmission to the memory device as the second clock signal during memory write operations in the second mode of operation.

In some aspects, the method includes configuring one or more line drivers or receivers to operate as differential line drivers in the second mode of operation, and configuring the one or more line drivers or receivers to operate as single-ended line drivers or receivers in the first mode of operation.

In an aspect of the disclosure, a memory controller includes clock generation logic configured to provide a first clock signal having a first frequency and a second clock signal having a second frequency greater than the first frequency, a first phase shifting circuit configured by training information to provide a first phase-shifted version of the second clock signal, a second phase shifting circuit configured by the training information to provide a second phase-shifted version of the second clock signal, and selection logic configured to provide a data clock signal to a memory device in a high-speed mode of operation, and to suppress the data clock signal in a low-power mode of operation. The first phase-shifted version of the second clock signal may be provided by the selection logic during memory read operations, in the second phase-shifted version of the second clock signal is provided by the selection logic during memory write operations.

In some aspects, the memory controller includes one or more line drivers configured to transmit a command clock signal to the memory device. The command clock signal may be a phase-shifted version of the first clock signal that is used to control transmissions of data to the memory device in the low-power mode of operation.

In some aspects, the memory controller includes a CDR circuit that provides a sampling clock based in part on transitions of signaling state on a data bus of a communication interface. The memory device may include logic configured to provide transitions in signaling state on the data bus when two or more bytes of data read from the memory device are identical.

In one aspect, the second frequency is at least double the first frequency. In some instances, the first frequency is no more than a quarter of the second frequency.

In some aspects, the memory controller includes one or more line drivers configured to couple the memory controller to the memory device. The one or more line drivers may operate as differential line drivers in the high-speed mode of operation and operate as single-ended line drivers in the low-power mode of operation.

In an aspect of the disclosure, a memory device includes a first phase shifting circuit configured by training information to provide a low-speed clock signal based on a first clock signal received from a communication interface coupling a memory device and a memory controller, a second phase shifting circuit configured by training information to provide a high-speed clock signal based on a second clock signal received from the communication interface, and selection logic configured to select between the low-speed clock signal and the high-speed clock signal to provide a data clocking signal. The low-speed clock signal may be used to sample commands received from a command bus of the communication interface. The high-speed clock signal may be selected as the data clocking signal in a high-speed mode of operation. The low-speed clock signal may be selected as the data clocking signal in a low-power mode of operation.

In one aspect, the second clock signal is suppressed in the low-power mode of operation.

In one aspect, the memory device includes logic configured to provide transitions in signaling state on a data bus of the communication interface when two or more bytes of data read from the memory device are identical. The memory device may be configured to provide a clock based in part on transitions of signaling state on the data bus. The second clock signal may have a frequency that is at least double the frequency of the first clock signal. In some instances, the first clock signal has a frequency that is no more than a quarter of the frequency of the second clock signal.

In one aspect, the memory device may include one or more receivers configured to receive a signal from the communication interface. The one or more receivers may operate as differential receivers in the high-speed mode of operation and operate as single-ended receivers in the low-power mode of operation.

In an aspect of the disclosure a method implemented at a memory device includes providing a low-speed clock signal based on a first clock signal received from a communication interface coupling a memory device and a memory controller, providing a high-speed clock signal based on a second clock signal received from the communication interface, using the low-speed clock signal to sample commands received from a command bus of the communication interface, using the high-speed clock signal to sample data received from the communication interface in a high-speed mode of operation, and using the low-speed clock signal to sample data received from the communication interface in a low-power mode of operation.

In one aspect, the method includes configuring a first phase shifting circuit using first training information received from the communication interface, and configuring a second phase shifting circuit using second training information received from the communication interface. The first phase shifting circuit may provide the low-speed clock signal. The second phase shifting circuit may provide the high-speed clock signal.

In one aspect, receivers associated with the second clock signal are disabled in the low-power mode of operation.

In one aspect, the second clock signal may have a frequency that is at least double the frequency of the first clock signal.

In one aspect, the method includes configuring one or more receivers to operate as differential receivers in the high-speed mode of operation, and configuring the one or more receivers to operate as single-ended receivers in the low-power mode of operation.

DETAILED DESCRIPTION

Figure 1:
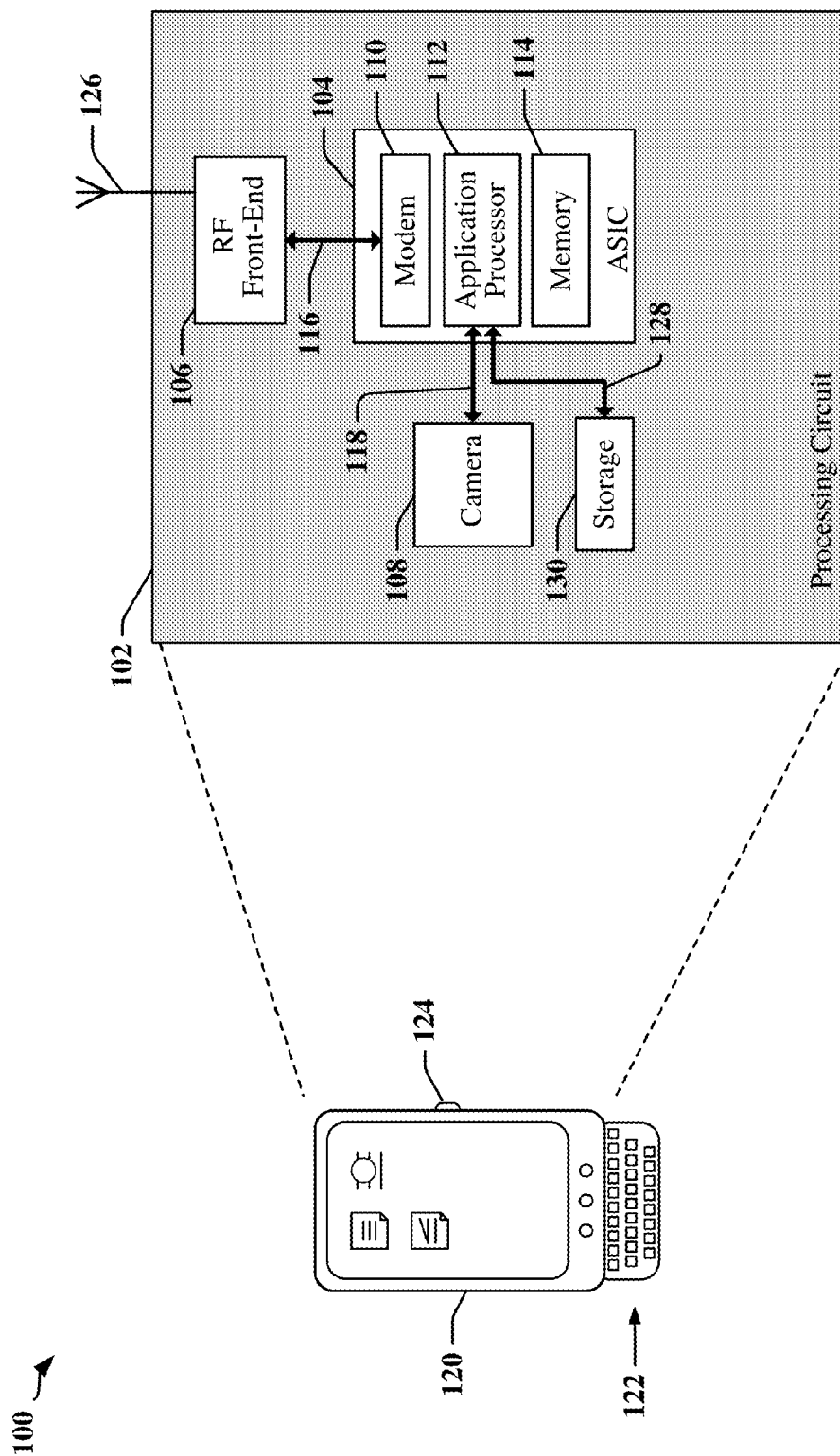
FIG. 1 depicts an example of apparatus employing low-power memory.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts.

Several aspects of integrated circuits (ICs), including SoC and DRAM devices will now be presented with reference to various apparatus and methods. These apparatus and methods will be described in the following detailed description and illustrated in the accompanying drawings by various blocks, modules, components, circuits, steps, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an SoC, memory card, an element, or any portion of an element, or any combination of elements may employ a processing system that includes one or more processors. Examples of processors include microprocessors, microcontrollers, digital signal processors (DSPs), field programmable gate arrays (FPGAs), programmable logic devices (PLDs), state machines, sequencing logic, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise.

Accordingly, in one or more exemplary embodiments, the functions described may be implemented in hardware, software, firmware, or any combination thereof. If implemented in software, the functions may be stored on or encoded as one or more instructions or code on a computer-readable medium. Computer-readable media includes computer storage media. Storage media may be any available media that can be accessed by a computer and may include transitory and non-transitory media. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

Overview

As the demand for high performance devices implementing integrated circuit (IC) technology has increased so has the demand for increased functionality, speed, and portability of the devices. The speed of operation associated with certain functions performed by the device may be determined by a number of factors including the rate at which data can be transferred between components of the devices. For example, the data rate of a communication link or bus used to transfer data between high-speed memory and a processor may be a limiting factor on the speed of operation of some functions. At higher data rates, power consumption associated with a processor, memory and/or a communication link or bus may limit battery lifetime. Furthermore, the device may perform certain functions that do not require high-speed operation. Accordingly, certain aspects disclosed herein relate to managing the operation of high-speed devices, including memory devices, and to conserving power in battery-powered devices.

Certain aspects of the invention may be applicable to communication links deployed between electronic devices that include subcomponents of an apparatus such as a telephone, a mobile computing device, an appliance, automobile electronics, avionics systems, etc. For example, an apparatus equipped with a camera may include a mobile computing device, a cellular phone, a smart phone, a session initiation protocol (SIP) phone, a laptop, a notebook, a netbook, a smartbook, a personal digital assistant (PDA), a satellite radio, a global positioning system (UPS) device, a smart home device, intelligent lighting, a multimedia device, a video device, a digital audio player (e.g., MP3 player), a camera, a game console, an entertainment device, a vehicle component, avionics systems, a wearable computing device (e.g., a smart watch, a health or fitness tracker, eyewear, etc.), an appliance, a sensor, a security device, a vending machine, a smart meter, a drone, a multicopter, or any other similar functioning device.

FIG. 1 depicts an example of an apparatus 100 that may employ a communication link between or within IC devices. In one example, the apparatus 100 may be a mobile communication device. The apparatus 100 may include a processing circuit having two or more IC devices 104, 106, 108, 130 that may be coupled using interfaces that include a high-speed communication link 116, 118, 128. One IC device 106 may be an RF front-end device 106 that enables the apparatus to communicate through one or more antennas 126 with a radio access network, a core access network, the Internet and/or another network. A camera IC device 108 may provide an imaging interface and/or imaging device. External storage devices 130 may comprise one or more memory devices coupled to an application processor 112 through high-speed memory bus 128. The RE front-end device 106, the camera IC device 108 and external storage devices 130 are examples of devices that may require high-speed data transmission when active, but may be inactive or operable at low speed during certain periods of time.

The processing circuit 102 may comprise a SoC and/or may include one or more application-specific IC (ASIC) devices 104. In one example, an ASIC device 104 may include one or more application processors 112, logic circuits, modems 110, and processor readable storage such as a memory device 114 and/or external storage devices 130. In one example, the memory device 114 and/or external storage devices 130 may maintain instructions and data that may be executed by a processing device on the processing circuit 102. The processing circuit 102 may be controlled by one or more of an operating system and an application programming interface (API) layer that supports and enables execution of software modules residing in storage media. The memory device 114 and/or external storage devices 130 may include read-only memory (ROM) or random-access memory (RAM), electrically erasable programmable ROM (EEPROM), flash cards, or any memory device that can be used in processing systems and computing platforms. The processing circuit 102 may include or have access to a local database or parameter storage that can maintain operational parameters and other information used to configure and operate apparatus 100. The local database may be implemented using one or more of a database module, flash memory, magnetic media, EEPROM, optical media, tape, soft or hard disk, or the like. The processing circuit may also be operably coupled to external devices such as the antennas 126, a display 120, operator controls, such as a button 124 and/or an integrated or external keypad 122, among other components.

Figure 2:
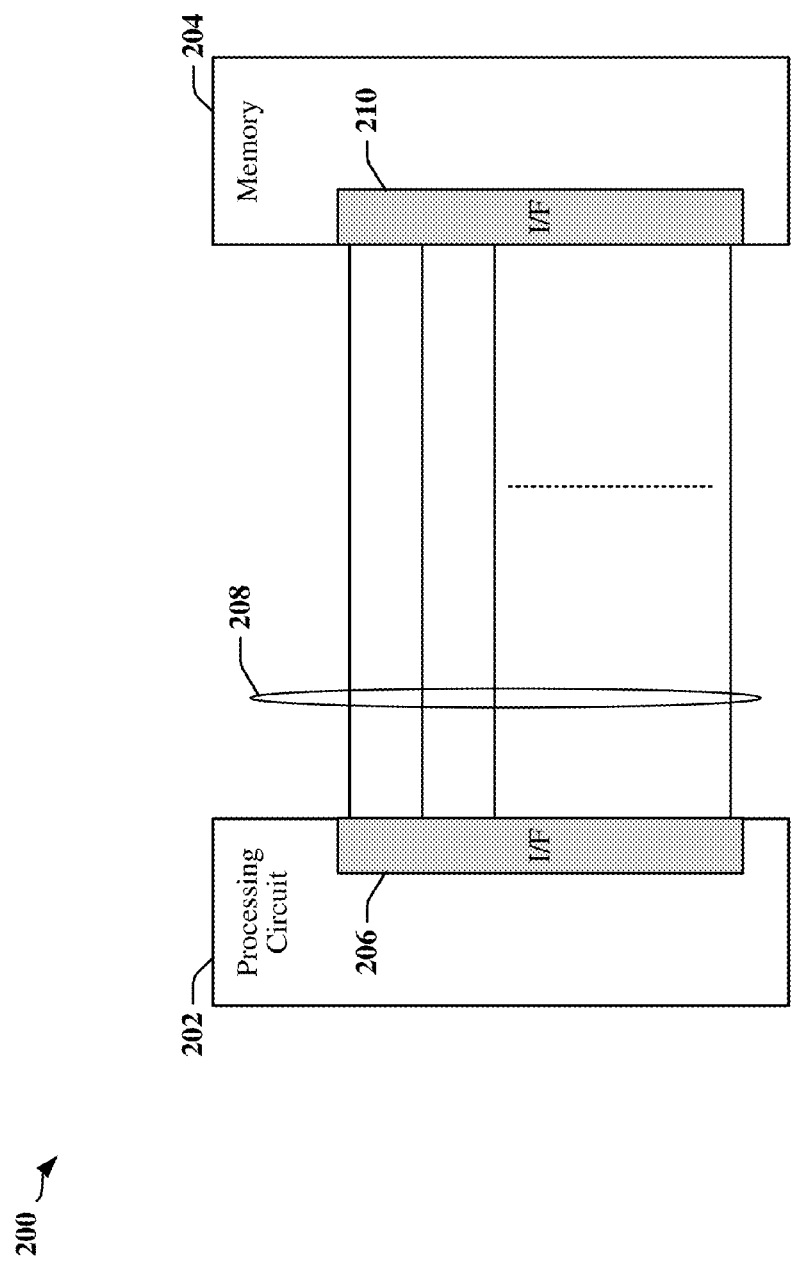
FIG. 2 is a simplified diagram illustrating a memory interface.

FIG. 2 illustrates an example of an apparatus 200 in which a processing circuit 202 may communicate with a memory 204 through a multi-wire bus 208. The processing circuit 202 and the memory 204 may include or be coupled to respective bus interface circuits 206, 210 that operate in accordance with a bus specification and/or bus protocol to enable communication between the processing circuit 202 and the memory 204. The bus interface circuits 206, 210 may be implemented using controllers, state machines, sequencing logic, etc. to implement the bus specification and/or bus protocol, which may enable high-speed reading and writing of data to the memory 204. The processing circuit 202 and a memory 204 may be components of the apparatus 100 depicted in FIG. 1, for example. Certain memory devices may employ a WCK clocking scheme, while other memory devices may use a data strobe signal (DQS signal) to determine when data is valid and/or can be reliably captured from data signals (DQ signals) on the bus 208

The bus 208 may include a number of connectors, wires, electrically conductive traces on a circuit board or chip carrier, package substrate, silicon (or alternative material) interposer, electrically conductive traces in a metallization layer of an IC, and/or other electrical connectors and devices. The bus 208 may include unidirectional and/or bidirectional connectors. The bus 208 may be configured to carry some combination of single-ended signals on individual connectors, and/or differential signals in corresponding pairs of connectors.

Figure 3:
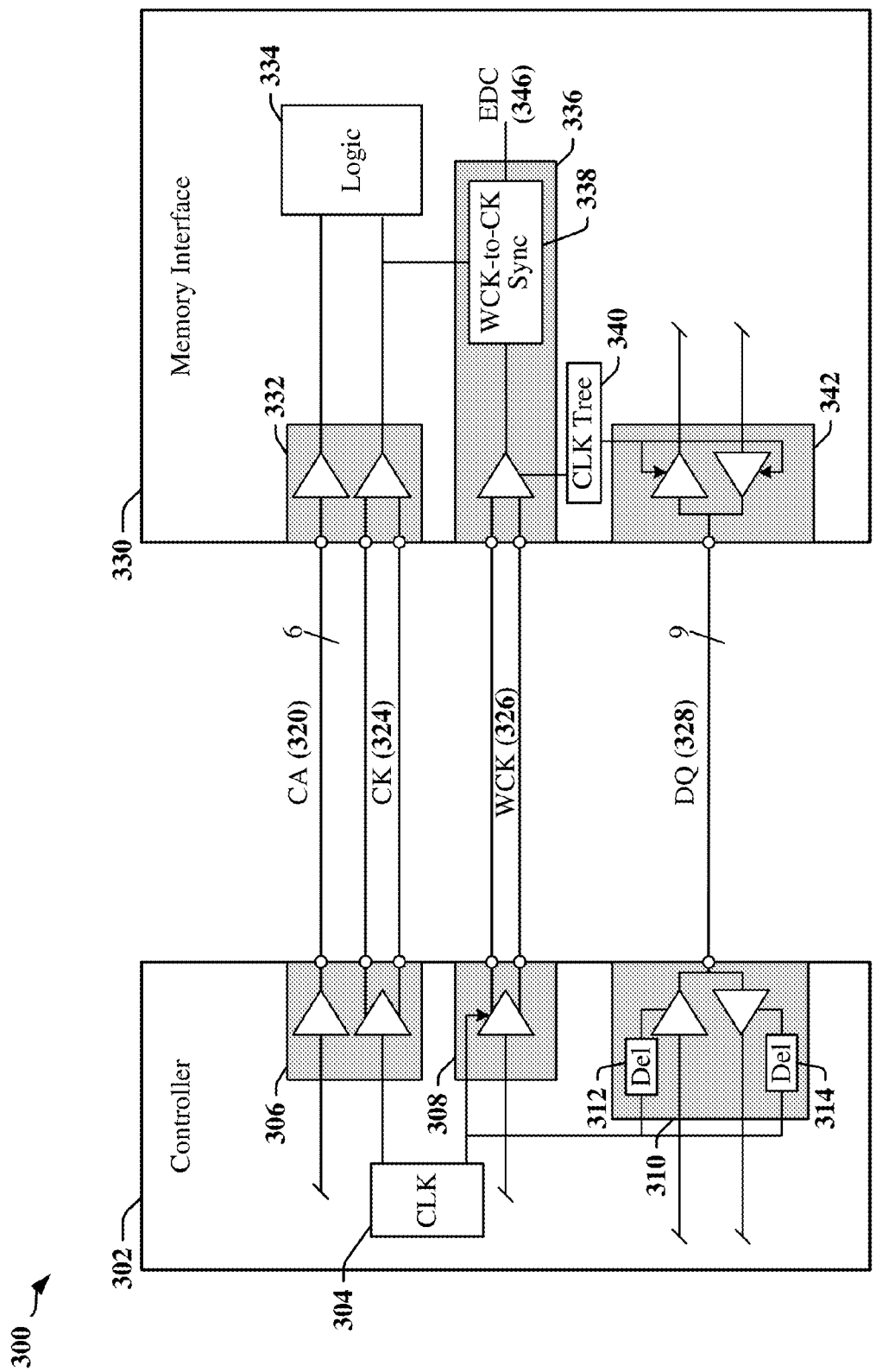
FIG. 3 is a diagram illustrating a first high-speed memory interface deployed within an apparatus that may be adapted according to certain aspects disclosed herein.

FIG. 3 illustrates a first example 300 of a high-speed memory interface that may be adapted to operate in accordance with certain aspects disclosed herein. A controller 302 associated with a processing circuit transmits data through a memory interface 330 associated with one or more memory devices. The data may be transmitted in a plurality of DQ signals 328 through single ended connectors. In one example, nine DQ signals 328 are used to transmit an 8-bit byte of data and a Data Mask (DM) Data Invert (DI) signal. A clock circuit 304 generates a WCK signal 326 and a CK signal 324, each of which may be transmitted as a differential signal on a pair of connectors. The WCK signal 326 is generated by the controller 302 and provides timing information that controls the bidirectional transfer of data over the high-speed interface. The CK signal 324 provides timing for the 6-bit command/address (CA) bus 320.

In the memory interface 330, a clock tree 340 may be provided to adjust sampling edges in the received WCK signal 326 such that the sampling edges occur within a sampling window that represents a time period during which data can be reliably extracted from the DQ signals 328. Additional logic 338 may be provided to determine the state of synchronization between the WCK signal 326 and the CK signal 324, and to generate an EDC signal 346 that can be provided to the controller 302 to adjust timing of one or more of the clock signals 324, 326 transmitted to the memory interface 330.

In one example, the GDDR5 high-speed memory interface uses a clocking scheme based on the WCK signal 326 to meet applications that require higher speed throughput to support processing intensive functions, and/or to transfer high volumes of data. A WCK-based memory interface may be associated with higher costs in terms of power consumption and I/O pin usage, based on the constantly toggling high-speed WCK signal 326 and the additional pins required in memory devices to handle an EDC signal 346 for each 8-bit data lane.

Figure 4:
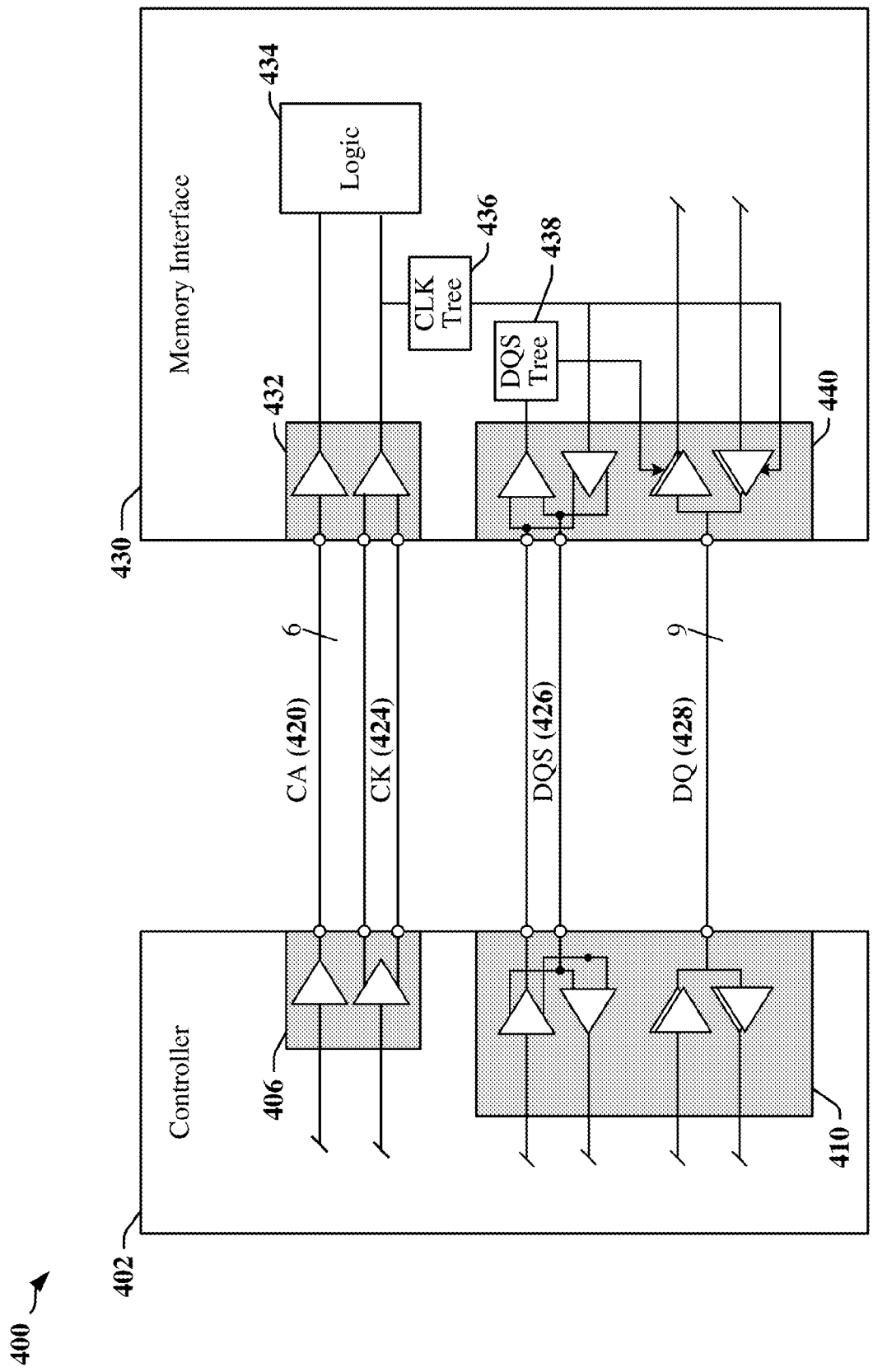
FIG. 4 is a diagram illustrating a second high-speed memory interface that may be adapted according to certain aspects disclosed herein.

FIG. 4 illustrates a second example 400 of a high-speed memory interface that may be adapted to operate in accordance with certain aspects disclosed herein. In this example, 400, the high-speed memory interface employs DQS clocking. A plurality of DQ signals 428 are used to transmit and receive data signals over a bidirectional bus in accordance with timing provided by strobe signals, including the DQS signal 426. In one example, DDR memory devices can transfer two data words per clock cycle, using both the positive edge and the negative edge of a clock signal. For data exchanged through the controller 402 and memory interface 430, a DQS signal 426 is transmitted to enable synchronization the operation of the transmitting and receiving devices.

In an example where data is read from a memory device, the controller 402 receives DQ signals 428 from the memory interface 430 that are edge-aligned with the corresponding DQS signal 426 transmitted by the memory interface 430. In some implementations, a delay locked loop may shift the DQ signals 428 with respect to a system clock to satisfy and/or maximize setup and hold constraints. In one example, the delay locked loop may introduce a 90 degrees shift between a DQS signal 426 and corresponding DQ signals 428.

In an example where data is written to a memory device, the controller 402 may transmit DQ signals 428 that are center-aligned and 90 degrees out of phase with the corresponding DQS signal 426. The memory interface 430 may include a clock tree circuit 438 that adjusts timing of the strobe signal received on the DQS signal 426 in order to reliably receive data from the DQ signals 428. When the memory interface 430 is transmitting to the controller 402 (that is, during a memory read operation), a second clock tree circuit 436 may be configured to derive a strobe signal based on the CK signal 424 timing circuit. This strobe signal is transmitted as the differential DQS signal 426.

DQS-based clocking schemes may offer lower power consumption, but can suffer the penalty of DQS signals 426 that toggle during write and read operations. DQS-based clocking schemes can have complicated training schemes and are not typically used for bus frequencies greater than 4.2 Gbps, DQS-based clocking schemes have a large clock insertion delay and increased jitter when delay elements are used to match the DQS clock tree time to the DQ signal path.

Conventional clocking schemes typically do not scale well with frequency. The clocking scheme remains essentially the same for high-speed and low-power and/or low-speed modes and may result in compromised performance and/or degraded power efficiencies, including at lower frequencies.

An Adaptable, Multi-Clock Rate Communication Interface

According to certain aspects disclosed herein, a memory interface may be implemented using an adaptive communication interface that provides a high-speed mode of operation and a low-power mode of operation, among other modes. In one example, the adaptive communication interface uses CK clocking in all modes, and WCK clocking in a high-speed mode. The adaptive communication interface may provide a low-power mode in which WCK signals may be gated or suppressed, and which may eliminate DQS toggling during read and write operations.

Figure 5:
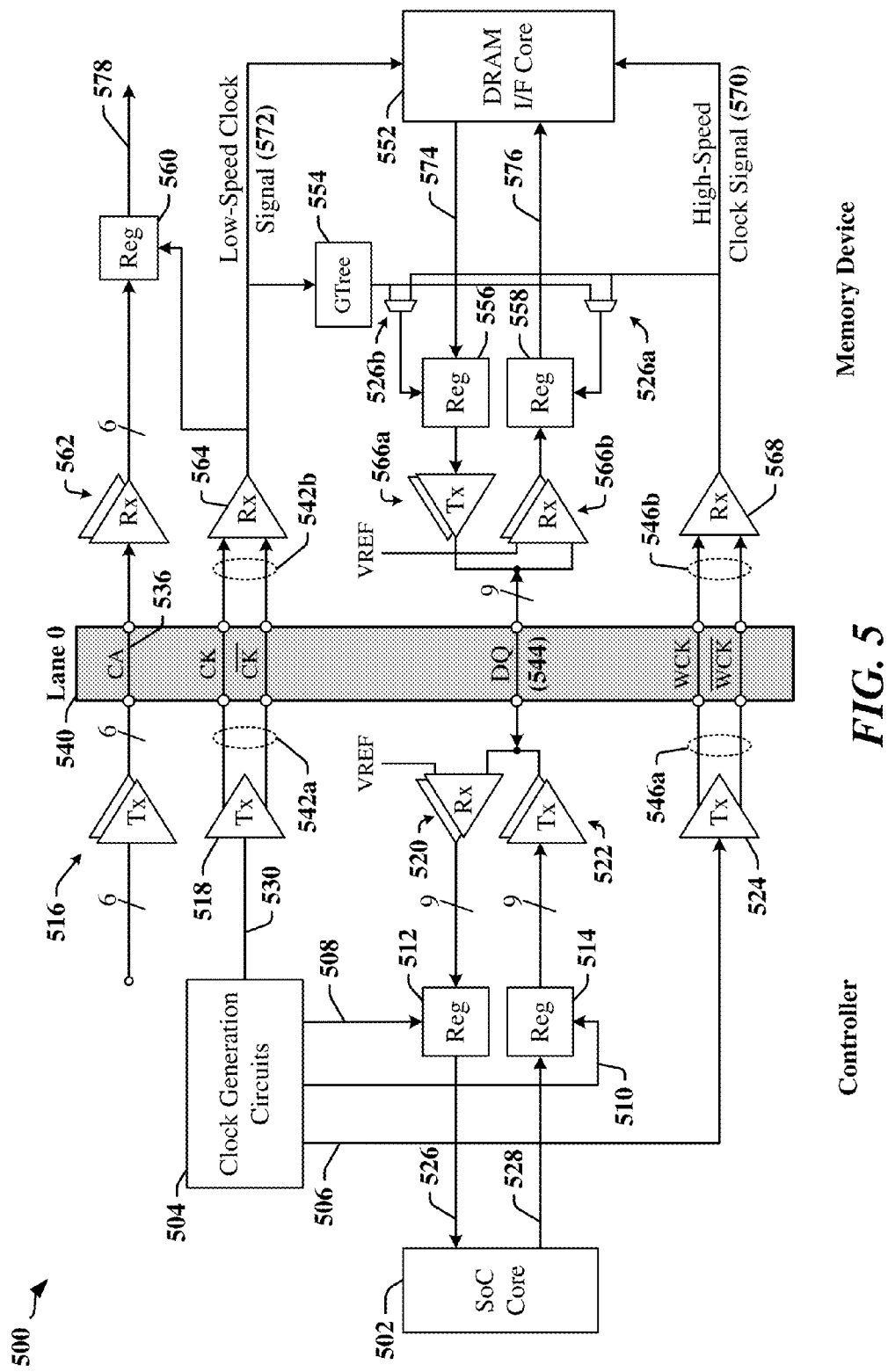
FIG. 5 illustrates an adaptive communication interface in accordance with certain aspects disclosed herein.

FIG. 5 illustrates an adaptable, multi-clock rate communication interface 500 according to certain aspects disclosed herein. The adaptable, multi-clock rate communication interface 500 may be configured for a high-speed mode of operation and one or more low-power modes of operation. In some implementations, it can be anticipated that the high-speed mode of operation is less frequently used than low-power modes of operation in devices such as mobile communication devices. When high-speed operation is not needed or desired, the low-power mode of operation may be invoked to conserve power. In the low-power mode, memory read and write operations may be performed using a reduced-frequency clock. In some instances, termination resistances may be coupled to the wires that carry high-speed signals during the high-speed mode of operation in order to reduce reflections and to create a larger sampling window during which data can be reliably sampled. In the low-power mode, the termination resistances may be decoupled from the wires, and transmission frequencies may be reduced such that a usable sampling window is available for sampling data. Further power savings may be achieved by the elimination of strobe signals and their associated capacitances. The use of strobe signals can be associated with significant power consumption at higher frequencies.

According to certain aspects disclosed herein, the communication interface 500 is employed in a memory interface that uses a high-speed clock signal 570 derived from the WCK clock transmitted on the differential lane 546a, 546b when operated in the high-speed mode. In the low-power mode, the WCK clock transmitted on the differential lane 546a, 546b is disabled or suppressed, and a low-speed clock signal 572 may be derived from the CK signal transmitted on the differential lane 542a, 542b to control transmissions of data in both directions. The low-speed clock signal 572 may also be used by various circuits of a DRAM interface core 552. The low-speed clock signal 572 may be available in multiple modes of operation, or all modes of operation. In some instances, the frequency of the CK signal transmitted on the differential lane 542a, 542b may be reduced below nominal or specified frequencies, and a modified command scheme may be employed to accommodate this lower-speed CK signal transmitted on the differential lane 542a, 542b.

According to certain aspects disclosed herein, the low-speed clock signal 572 may have a frequency that is 25% or less of the frequency of the high-speed clock signal 570. The use of a lower frequency transmission clock during low-power mode can provide significant savings in dynamic power, including power consumption attributable to charging and discharging of capacitances in the communication interface 500. In addition to elimination of line terminators in the low-power mode, the EDC I/O pin may also be eliminated, producing further power savings.

A controller of the adaptable, multi-clock rate communication interface 500 may include clock generation circuits 504 that may be controlled or configured to produce a plurality of clock signals, including a high-speed clock signal 506 and a low-speed clock signal 530 to be transmitted on one or more lanes 546a, 542a of the communication interface 500. The plurality of clock signals may include a transmitter clock 510 used to control data transmissions over the DQ wires 544 when data is transmitted from the controller to a memory device using line drivers 522, for example. The plurality of clock signals may also include a data sampling clock 508 used to capture data received by line receivers 520 from the DQ wires 544 when the controller is receiving data from the memory device, for example. In one example, the sampling clock 508 and the transmitter clock 510 may control the operation of respective registers 512, 514. The registers 512, 514 may be coupled to the DQ wires 544 through line receivers 520 and line drivers 522, respectively. The clock signals 506 and 530 may be coupled to wire pairs of the respective differential lanes 546a and 542a by corresponding differential drivers 524 and 518. Command and control data may be transmitted using a set of line drivers 516 coupled to the wires 536 of the CA bus.

A memory device of the adaptable, multi-clock rate communication interface 500 may differential receivers 568, 564 configured to receive a high-speed clock 570 and a low-speed clock signal 572 from respective lanes 546a, 542a of the communication interface 500. Command and control data may be received from the wires 536 of the CA bus using a set of line receivers 562. The low-speed clock signal 572 may be used to clock registers 560 that sample the command and control data.

The memory device may include line drivers 566a and line receivers 566b coupled to the DQ wires 544. In one example, registers 556, 558 may be coupled to the DQ wires 544 through line drivers 566a and line receivers 566b, respectively. One set of registers 556 is used to transmit data from the memory device to the controller and the other set of registers 558 is used to capture data received from the controller at the memory device. One of the clock signals 570 and 572, or another clock signal derived from one of the clock signals 570 and 572, may be used to control the operation of the registers 556, 558. In a high-speed mode of operation, the high-speed clock signal 570 may be provided to the registers 556, 558 by logic circuits 526a and/or 526b. In a low-power mode of operation, the logic circuits 526a and/or 526b may provide the low-speed clock signal 572 to the registers 556, 558, in some examples, a clock distribution circuit 554 may be used to distribute the low-speed clock signal 572 through the memory device, and/or to provide a lower-speed clock signal for controlling the registers 556, 558.

Figure 6:
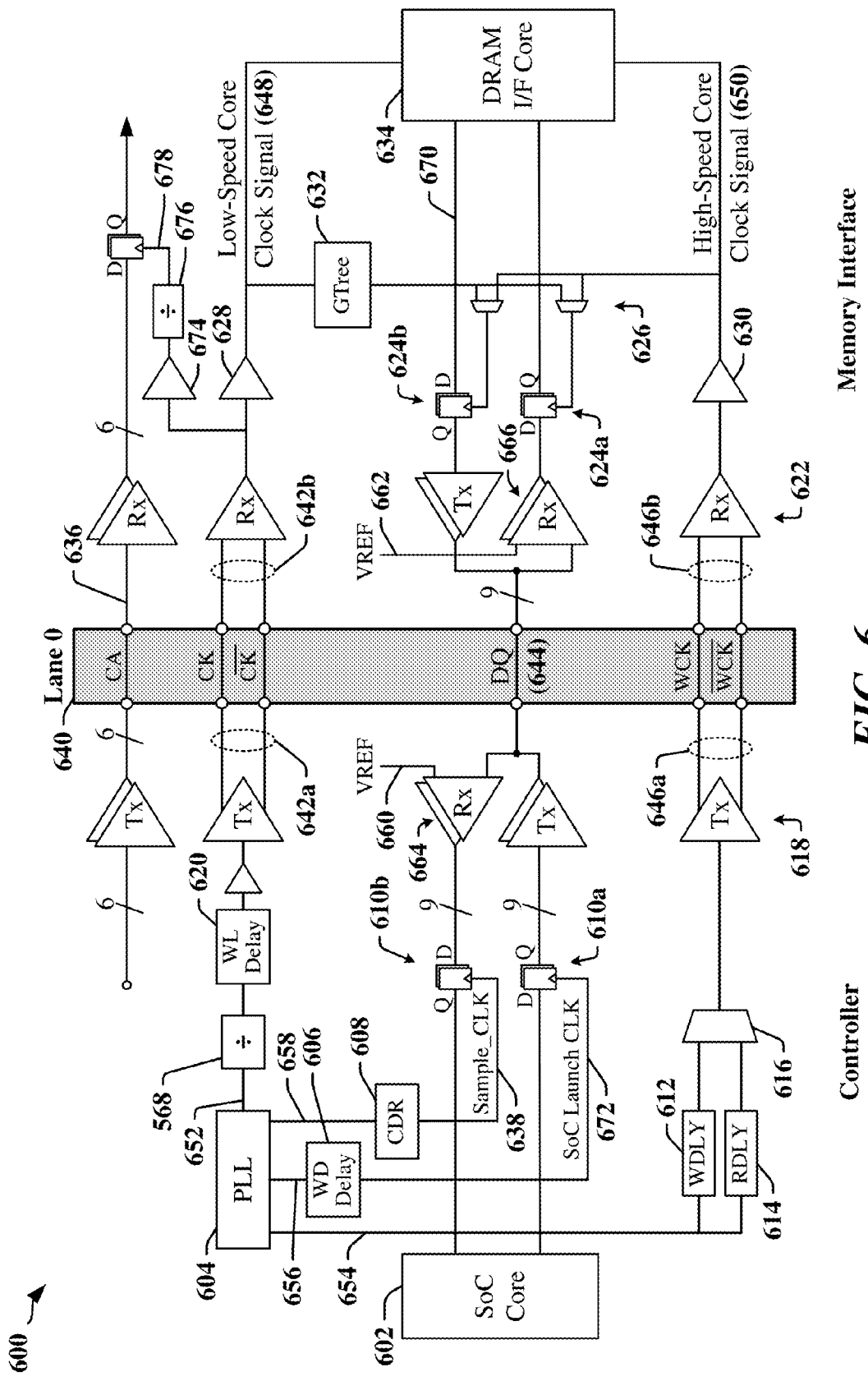
FIG. 6 illustrates one example of an implementation of an adaptive communication interface adapted in accordance with certain aspects disclosed herein.

FIG. 6 illustrates one example of an implementation of an adaptable, multi-clock rate communication interface 600 in accordance with certain aspects disclosed herein. The adaptable, multi-clock rate communication interface 600 may be configured for a high-speed mode of operation and a low-power mode of operation. When high-speed operation is not needed, the low-power mode of operation may be invoked to conserve power. In the low-power mode, memory read and write operations are performed using a reduced-frequency clock. In some instances, termination resistances may be coupled to the wires that carry high-speed signals during the high-speed mode of operation in order to reduce reflections and to create a larger sampling window during which data can be reliably sampled. In the low-power mode, the termination resistances may be decoupled from the wires, and transmission frequencies may be reduced such that a usable sampling window is available for sampling data. Further power savings may be achieved by the elimination of strobe signals and their associated capacitances. The use of strobe signals can be associated with significant power consumption at higher frequencies.

According to certain aspects disclosed herein, the communication interface 600 includes a memory interface that uses a high-speed core clock signal 650 derived from the WCK clock 646a, 646b when operated in the high-speed mode. In the low-power mode, the WCK clock 646a, 646b is disabled or suppressed and a low-speed core clock signal 648 may be derived from the CK signal 642a, 642b to control transmissions of data in both directions. The low-speed core clock signal 648 may also be used by a DRAM interface core 634. The low-speed core clock signal 648 may be available in multiple or all modes of operation. In some instances, the frequency of the CK signal 642a, 642b may be reduced below nominal or specified frequencies, and a modified command scheme may be employed to accommodate this lower-speed CK signal 642a, 642b frequency.

According to certain aspects disclosed herein, the low-speed core clock signal 648 may have a frequency that is 25% or less of the frequency of the high-speed core clock signal 650. The use of a lower frequency transmission clock during low-power mode can provide significant savings in dynamic power, including power consumption attributable to charging and discharging of capacitances in the communication interface 600.

FIGS. 7-10 are timing diagrams that illustrate aspects related to the operation of the communication interface 600. The communication interface 600 enables an SoC core 602 to communicate with the DRAM interface core 634 in order to read data from memory, and write data to memory. The SoC core 602 may configure phase-locked loop circuits 604 to produce one or more clock signals 652, 654, 656 used to control transmissions through the communication interface 600. A first clock signal 652 may serve as the basis for the global low-speed core clock signal 648 used by the communication interface 600 and transmitted as the CK signal 642. The first clock signal 652 may be divided using dividing logic 668 and a programmable delay element 620 and/or a clock tree may be used to obtain a desired phase shift relative to the CA signals 636 and/or the DQ signals 644 before transmission as the differential CK signal 642a. The phase shift may be configured based on training information identifying phase shifts 702, 802 between the transmitted CK signal 642a and the received CK signal 642b, and/or phase shifts introduced by the channel 640 to the CA signals 636 and/or DQ signals 644.

A second clock signal 654 may provide a basis for the high-speed WCK signal 646a. The WCK signal 646a is used in both write and read operations in high-speed modes. A write delay element 612 and a read delay element 614 provide desired phase shifts for the write and read operations, respectively. The phase shifts may be calculated to correct or adjust for phase shifts introduced in the channel 640 and/or by circuits in the receiver. A multiplexer 616 selects between the two phase-shifted versions of the second clock signal 654 based on the type of operation being performed on the communication interface 600. The output of the multiplexer 616 drives the differential WCK signal 646a.

A third clock signal 656 may be provided to a delay element 606, the output of which clocks data into the registers 610a for transmission as DQ signals 644. The fourth clock signal 658 may be provided to a CDR circuit 608, which samples the DQ signals 644 during memory read operations using registers 610b. Each of the delay elements 606, 612, 614, and 620 may be programmed based on training procedures used to determine signaling characteristics of the clock signals 642, 646 and the DQ signals 644. Delay values may be selected to maximize the sampling window, which corresponds to the time in which the DQ signals 644 are stable such that data may be reliably sampled.

The DRAM interface core 634 may receive the low-speed core clock signal 648 from a digital programmable delay line 628, which may be configured to provide a phase-shifted version of the received CK signal 642b. The low-speed core clock signal 648 may also be provided to multiplexers 626, which select between source clocks based on a current mode of operation. The high-speed core clock signal 650 may also be provided to the multiplexers 626. The high-speed core clock signal 650 is received from a second digital programmable delay line 630 which may be configured to provide a phase-shifted version of the received WCK signal 646b. The high-speed core clock signal 650 may also be provided to the DRAM interface core 634.

During write operations, the DRAM interface core 634 receives data sampled from the DQ signals 644 by a set of registers 624a. The registers 624a are controlled by the core clock signal 648 or 650 corresponding to the current mode of operation. Data 670 to be transmitted on the DQ signals 644 are clocked through a set of latches 624b controlled by the low-speed core clock signal 648 or the high-speed core clock signal 650 based on the current mode of operation. In low-power and/or low-speed modes of operation, data transfers are clocked based on the low-speed core clock signal 648. Gating tree logic 632 may be configured to condition the low-speed core clock signal 648 while date is communicated on the DQ signals 644, and to gate or otherwise block the low-speed core clock signal 648 when the DQ signals 644 are idle. Gating the low-speed core clock signal 648 may reduce power dissipation in certain circuits and components of both the transmitter and the receiver during idle periods.

The DQ signals 644 may be received by comparators 664, 666, which compare the voltage levels on the DQ signals 644 to a reference voltage 660, 662 respectively. In order to optimize the sampling window available for capturing data transmitted on the DQ signals 644, the reference voltages 660, 662 may be adjusted based on training results. It will be appreciated that the reference voltages 660, 662 may have different values for different modes of operation. For example, during higher speed mode of operation, the wires of the high-speed connectors may be terminated or otherwise impedance matched, while these wires are not connected to terminations in the lower speed mode of operation. Termination may affect voltage levels on the connectors.

A sampling signal (CKDIV2 signal) 678 may be used to capture information from received CA signals 636. The CKDIV2 signal 678 may be derived from the CK signal 642b derived from the CK signal 642b. A programmable delay line 674 and/or dividing logic 676 may be configured to produce the CKDIV2 signal 678 with a desired phase relationship to the CA signals 636.

Power Savings in a Multi-Clock Rate Communication Interface

The ability to switch between high-speed and low-power modes of operation can produce significant reductions in power consumption, particularly in mobile communication devices. In many instances, high-speed modes of operation may be required for a small percentage of operations and an average mobile communication device that employs or implements the communication interface 600 of FIG. 6 may be configured for high-speed modes for less than 1% of its operating time. High-speed modes may be reserved for occasions when a mobile communication device is involved in an active voice call while capturing high-definition video, for example.

In some instances, the communication interface 600 may be configured or adapted to switch between modes based on application requirements, battery charge level, and/or power budget considerations. Dynamic power dissipation (P) may be calculated or estimated using the equation $P=\frac{1}{2}CV^2F$, were C includes pin capacitance, V is signaling voltage and F is the frequency at which signals are switched. The communication interface 600 may be adapted or configured to control transmissions using the CK signal 642a, 642b and suppress the WCK signal 646a, 646b when operating in a low-power, low-speed mode of operation.

Figure 7:
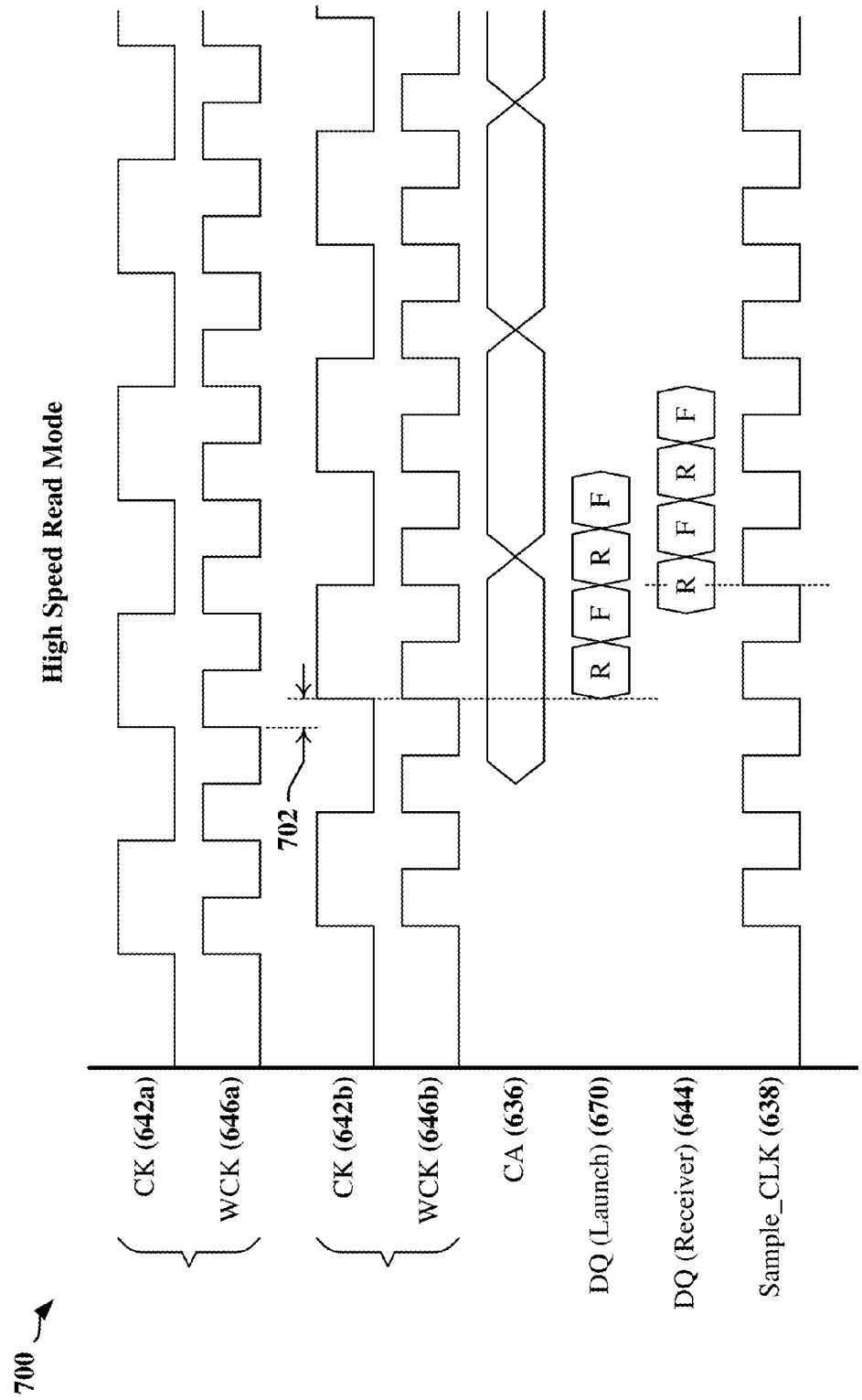
FIG. 7 illustrates an example of high-speed read mode timing for an adaptive communication interface in accordance with certain aspects disclosed herein.
Figure 8:
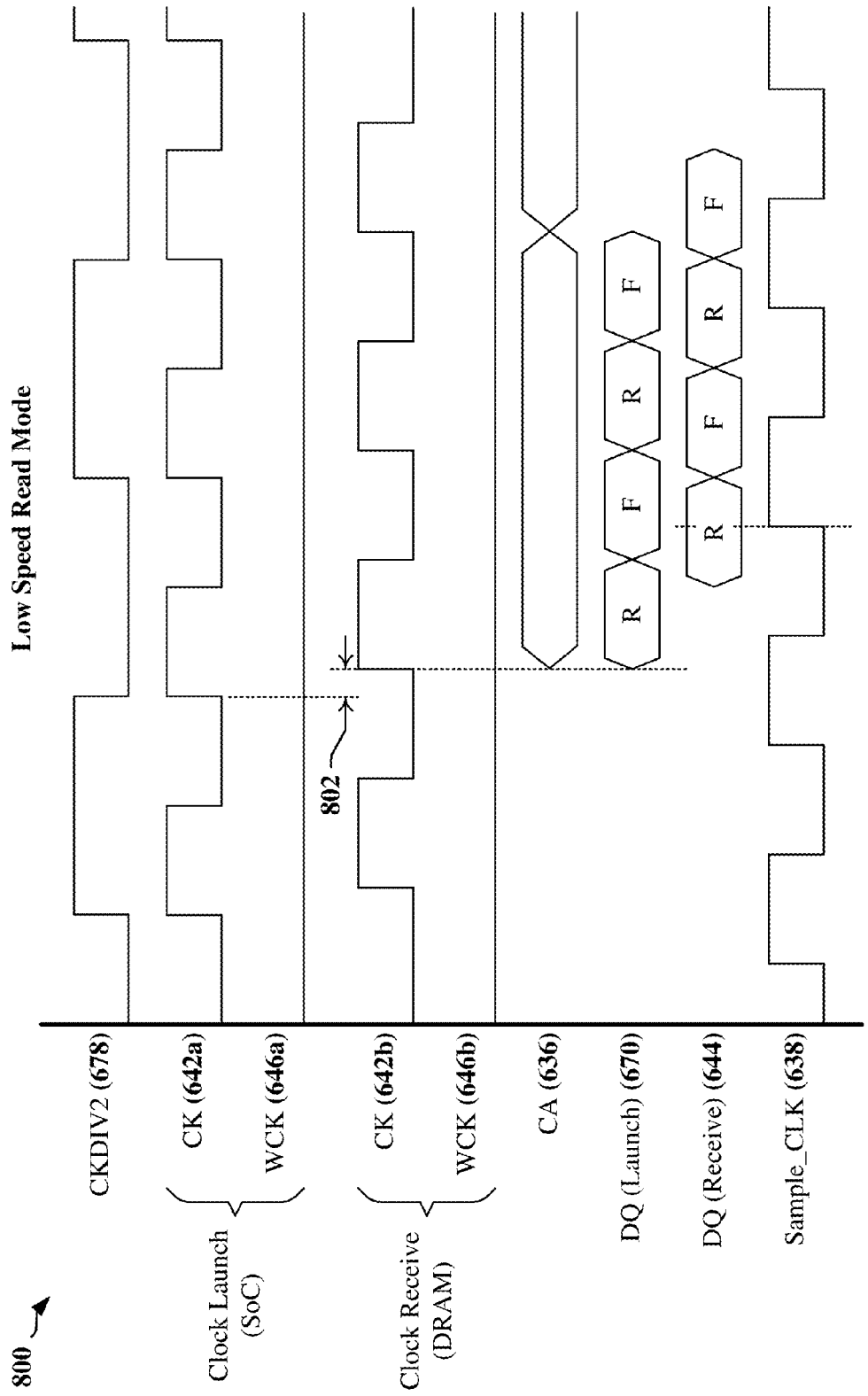
FIG. 8 illustrates an example of low-speed read mode timing for an adaptive communication interface in accordance with certain aspects disclosed herein.
Figure 9:
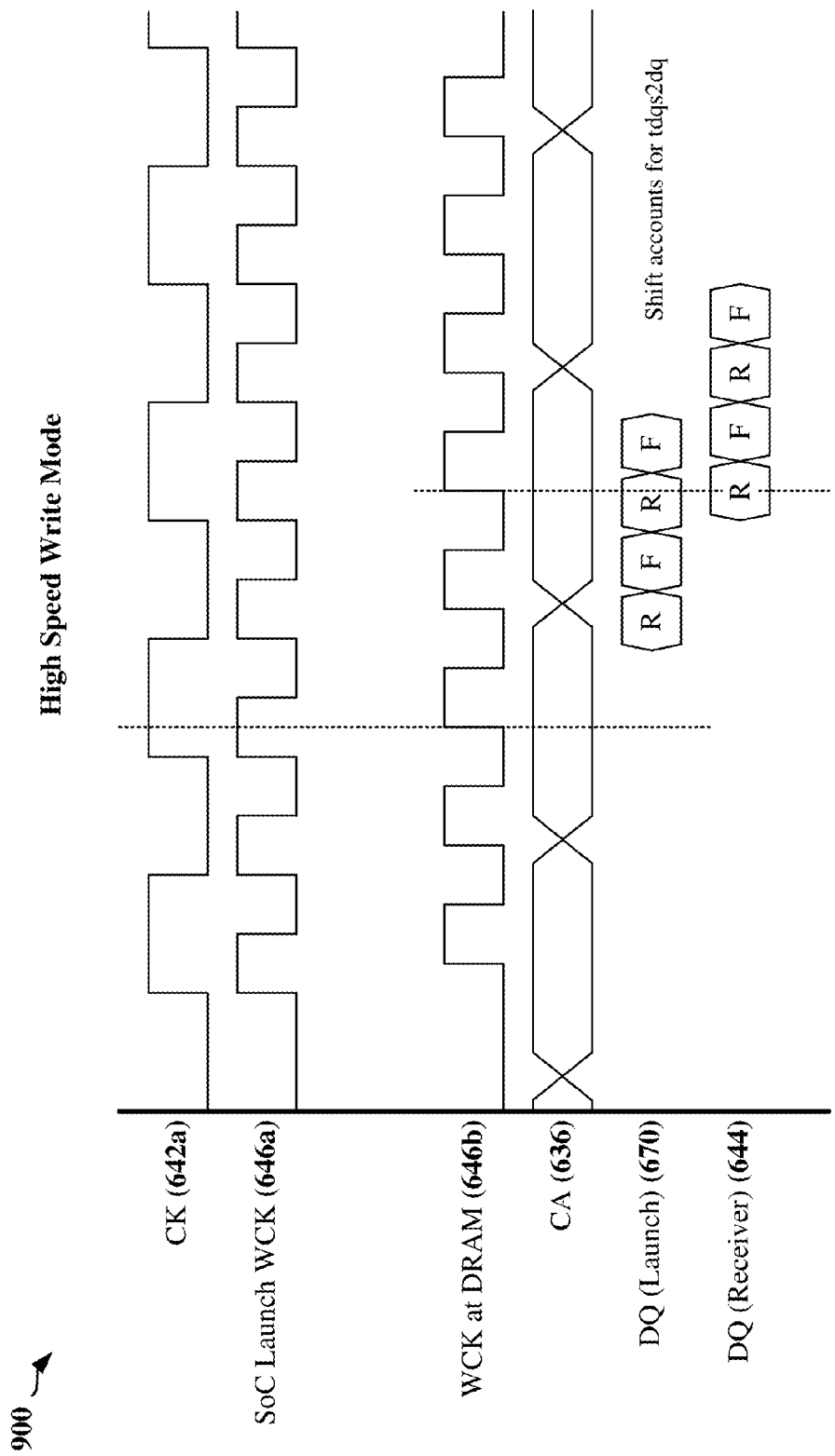
FIG. 9 illustrates an example of high-speed write mode timing for an adaptive communication interface in accordance with certain aspects disclosed herein.
Figure 10:
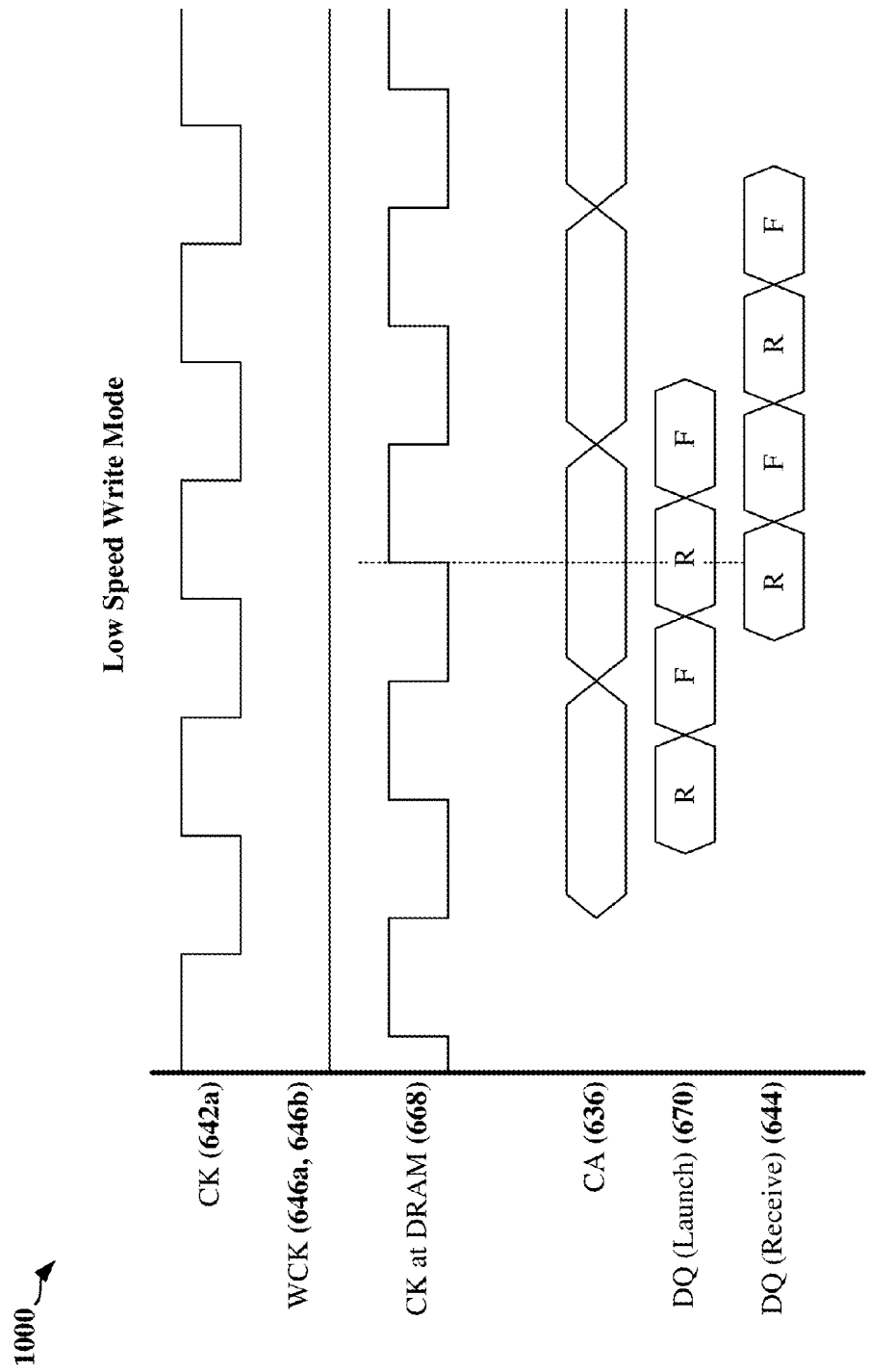
FIG. 10 illustrates an example of low-speed write mode timing for an adaptive communication interface in accordance with certain aspects disclosed herein.

FIG. 7 illustrates timing related to a high-speed read mode of operation, FIG. 8 illustrates timing related to a low-speed read mode of operation, FIG. 9 illustrates timing related to a high-speed write mode of operation, and FIG. 10 illustrates timing related to a low-speed write mode of operation. When the WCK signal 646a, 646b is suppressed, dynamic power dissipation in the WCK driver circuits 618 and receiver circuits 622 can be practically eliminated, and power dissipation associated with the DQ signals 644 may be reduced by a factor estimated as $(f_{HIGH}-f_{LOW})$, where $f_{HIGH}$ represents the frequency of the WCK signal 646a, 646b and $f_{LOW}$ represents the frequency of the CK signal 642a, 642b in the low-power mode of operation. Additional power savings may be realized in low-power modes of operation when the gating tree logic 632 is operated to shut off the low-speed core clock signal 648 from transmit circuits during periods when the DQ signals 644 are idle.

According to certain aspects disclosed herein, read operations in high-speed mode are clocked using the WCK signal 646 transmitted by the controller and DQS I/O pins are rendered redundant. In some conventional interfaces, a DQS signal is transmitted with every data lane that carries eight bits of data. Eliminating the DQS I/O pins may result in reductions in power consumption and can reduce overall pin capacitance. Additional power may be conserved by eliminating or reducing clock tree complexity used to match multiple clock trees when DQS strobe signals are used. The CK signal 642a and WCK signal 646a typically exhibit low jitter. In some instances, the communication interface 600 may be adapted to provide DQS signals where needed or indicated by application type or design. Write leveling options may be employed to determine when the DQS signals may be gated during write operations and CK signal 642 and/or DQ signal 644 timing may be adjusted by the SoC core 602 using one or more delay elements 606, 612, 614, 620.

Additional reductions in power consumption may be attributed to the use of a unidirectional WCK signal 646a, 646b, rather than a bidirectional clocking signal. Bidirectional signals may include additional circuits and pin capacitance that can lead to measurable increased power consumption with respect to circuits and pin capacitance associated with unidirectional clock signals.

Control and Configuration of the Multi-Clock Rate Communication Interface

One or more processing circuits may be used to configure and operate the communication interface 600. In one example, the SoC core 602 may include or cooperate with a processing circuit that can determine a current mode of operation, configure the communication interface 600, and control or manage data flows through the communication interface 600. In one example, the processing circuit may generate commands to write data to memory or read data from memory. In another example, the processing circuit may receive read or write commands. The processing circuit may determine whether data is to be handled using a low-power mode of operation or a high-speed mode of operation. The processing circuit may configure the clocking scheme for the communication interface 600 in accordance with the mode of operation to be used. The processing circuit may also initialize the communication interface 600 and configure various delays, phase shifts and other configuration parameters used to control the communication interface 600.

A processing circuit associated with the receiver (e.g., in the DRAM interface core 634) may perform a read training process to determine signaling characteristics of the memory bus, and/or selected connectors of the memory bus, in one example, the controller and memory device cooperate in performance of a training process during memory initialization in which phase differences between clock signals, address signals, and/or data signals may be determined. Based on the results of the training process, reference voltages 660, 662 and phase shifts may be calculated for the CK signal 642 and/or the WCK signal 646. Based on these calculations, one or more delay elements 606, 612, 614, 620 and/or digital programmable delay lines 628, 630, 674 may be calibrated to obtain an optimized sampling window. In a first, high-speed mode of operation, the CK signal 642 may be operated at a frequency that is half or quarter the rate of the frequency used during high-speed modes of operation. In a second, low-power mode, the WCK signal 646 is disabled, and the CK signal 642 is used to clock data on the DQ signals 644. The DRAM interface core 634 may maintain various configuration parameters defining programming delays, reference voltages and multiplexers, etc., for each mode of operation. For example, each set of configuration parameters may define configuration values for one or more phase-shifting logic elements, where the values are calculated to provide an optimized phase offset for a read and/or write clock. Training may be performed during startup procedures after device initialization. For low-power, low-speed modes of operation, additional training may not be needed, or may be performed when errors are detected, changes in temperature are detected, and/or after predefined prolonged periods of time. Periodic training may be performed during high-speed modes of operation. One or more processing circuits may be adapted or configured to implement an error correction code (ECC) memory system.

According to certain aspects disclosed herein, digital programmable delay line circuits may be provided in, or configured by the SoC, for compatibility with other memory systems and for other reasons. For example, digital programmable delay circuits are a key concept of LPDDR system, where logic absorbs the processing and area burden of closing timing in the DRAM system.

Figure 11:
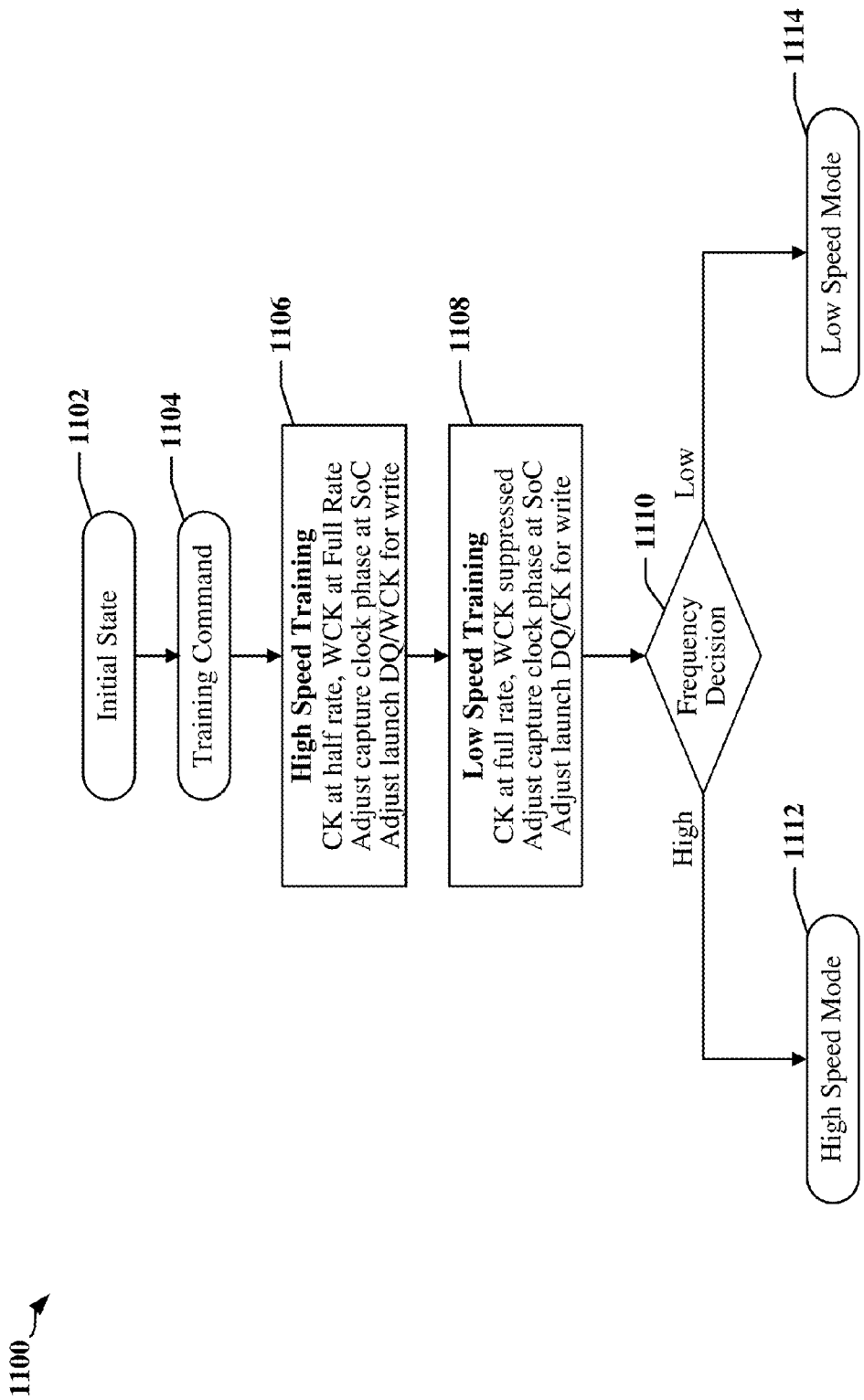
FIG. 11 is a flow chart of a method for initiating an adaptive communication interface in accordance with certain aspects disclosed herein.

FIG. 11 is a flow chart of a method for initiating the communication interface 600 in accordance with certain aspects disclosed herein. The communication interface 600 may commence at block 1102 from an initial state. The initial state may be entered after a power-up event, a system or device reset, and/or after detection of an error condition affecting data transferred over the communication interface 600.

At block 1104, the communication interface 600 may issue or receive a training command. The communication interface 600 may then enter a training state in which the channels, or signal paths in the communication interface 600 may be characterized, equalized, or otherwise configured.

In one example, high-speed training may be performed at block 1106. The high-speed training process may be performed after the CK clock signal 642a is set to half rate and the WCK signal 646a is set to full rate. Based on observed or measured performance of the communication interface 600, one or more clocks, including the phase of the sampling clock signal 638 in the SoC, may be configured. In some instances, launch timing associated with DQ signals 644 and the WCK signal 646a may be adjusted for high-speed writes.

Low-speed training may be performed at block 1108. The low-speed training process may be performed after the CK clock signal 642a is set to fall rate and the WCK signal 646a is gated or otherwise suppressed. Based on observed or measured performance of the communication interface 600, one or more clocks, including the phase of the sampling clock signal 638 in the SoC may be configured. In some instances, launch timing associated with DQ signals 644 and the CK signal 642a may be adjusted for low-speed writes.

An initial mode of operation may be determined at block 1110. When the high-speed mode of operation is indicated, the communication interface 600 may enter the high-speed mode at block 1112. When the low-power mode of operation is indicated, the communication interface 600 may enter the low-power mode at block 1114. The determination of mode of operation may be configured by a processing circuit under control of one or more applications. In various examples, the initial mode of operation selected is the low-power mode of operation.

Figure 12:
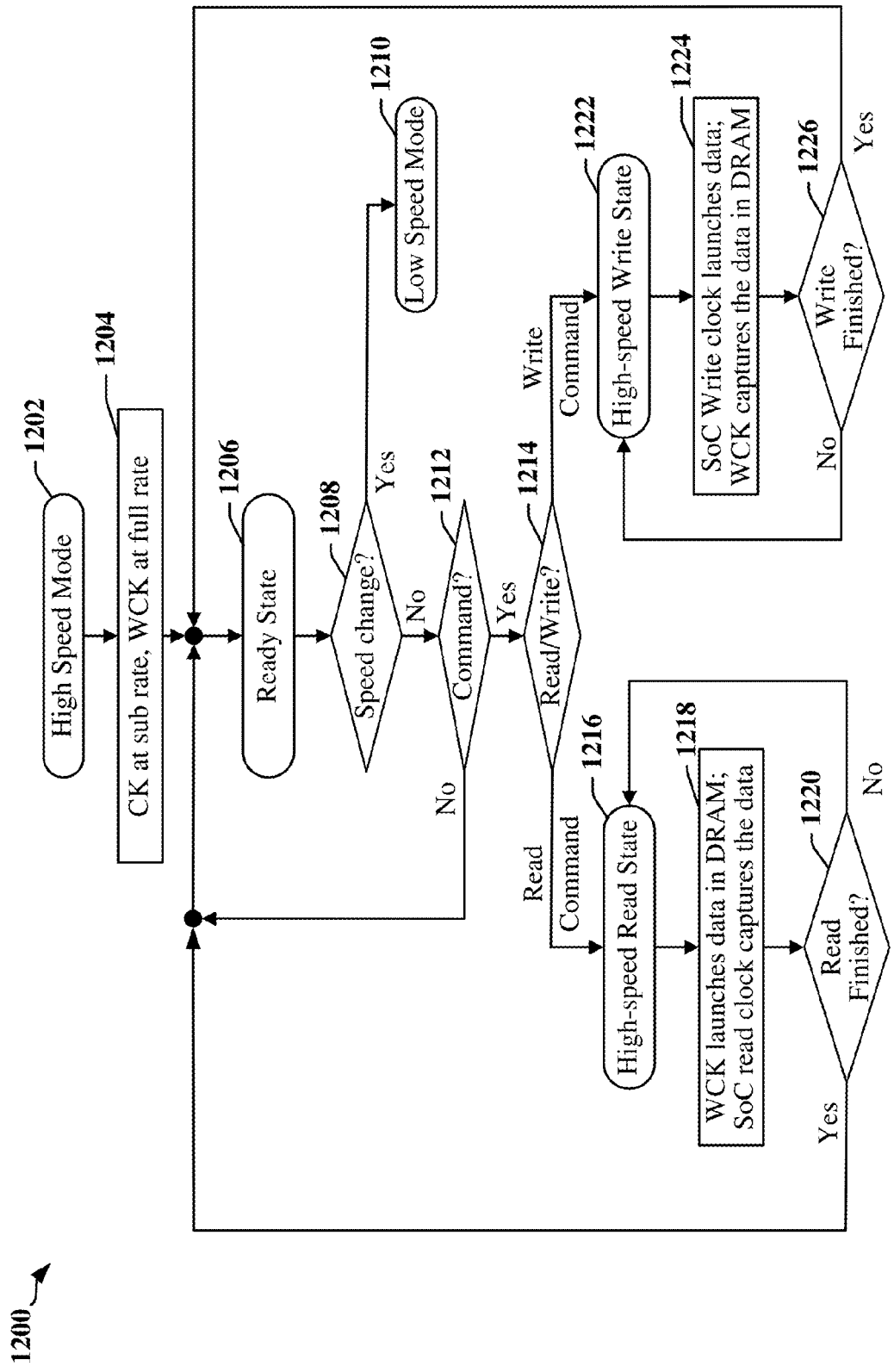
FIG. 12 is a flow chart of a method for operating an adaptive communication interface in a high-speed mode in accordance with certain aspects disclosed herein.

FIG. 12 is a flow chart of a method for operating the adaptive communication interface 600 in a high-speed mode in accordance with certain aspects disclosed herein. The communication interface 600 may be configured for high-speed operation after being placed in a high-speed mode at block 1202.

At block 1204, the CK clock signal 642a may be set to a lower rate (sub-rate CK) and the WCK signal 646a is set to full rate. In one example the lower rate may correspond to half-rate.

At block 1206, the communication interface 600 may be placed in a ready state. In the ready state, the communication interface 600 may be responsive to read commands, write commands and/or mode of operation commands or control signals.

At block 1208, the communication interface 600 may determine whether a change in mode of operation is indicated. If a change is indicated, the communication interface 600 may enter a low-power mode at block 1210. Otherwise, the communication interface 600 may proceed to block 1212.

At block 1212, the communication interface 600 may determine whether a command has been received. If no command has been received, then the communication interface 600 may continue the ready state at block 1206. If a command has been received, the communication interface 600 may determine at block 1214 whether the command is a read command or write command. For a read command, the process continues at block 1216. For a write command, the process may continue at block 1222. The decision blocks 1208, 1212, 1214 may be performed in a polled manner, as depicted. In some instances, the communication interface 600 may receive interrupts or other signals that cause it to determine a type of command that has been received. Accordingly, each decision block 1208, 1212, 1214 may be entered independently and/or asynchronously in some instances.

When a read command has been received, the communication interface 600 may enter a high-speed read state at block 1216. In this mode, and as depicted in block 1218, the WCK signal 646b is used to launch data from the DRAM, and the sampling clock signal 638 generated by the CDR circuit 608 is used to capture the data at the SoC. The communication interface 600 may perform reads repetitively until it is determined at block 1220 that the read command has been completed or otherwise terminated. Upon completion of the read command, the communication interface 600 may return to the ready state at block 1206.

When a write command has been received, the communication interface 600 may enter a high-speed write state at block 1222. In this mode, and as depicted in block 1224, the SoC write clock signal 672 is used to launch data from the SoC, and the WCK signal 646b is used to capture the data at the DRAM. The communication interface 600 may perform writes repetitively until it is determined at block 1226 that the write command has been completed or otherwise terminated. Upon completion of the write command, the communication interface 600 may return to the ready state at block 1206.

Figure 13:
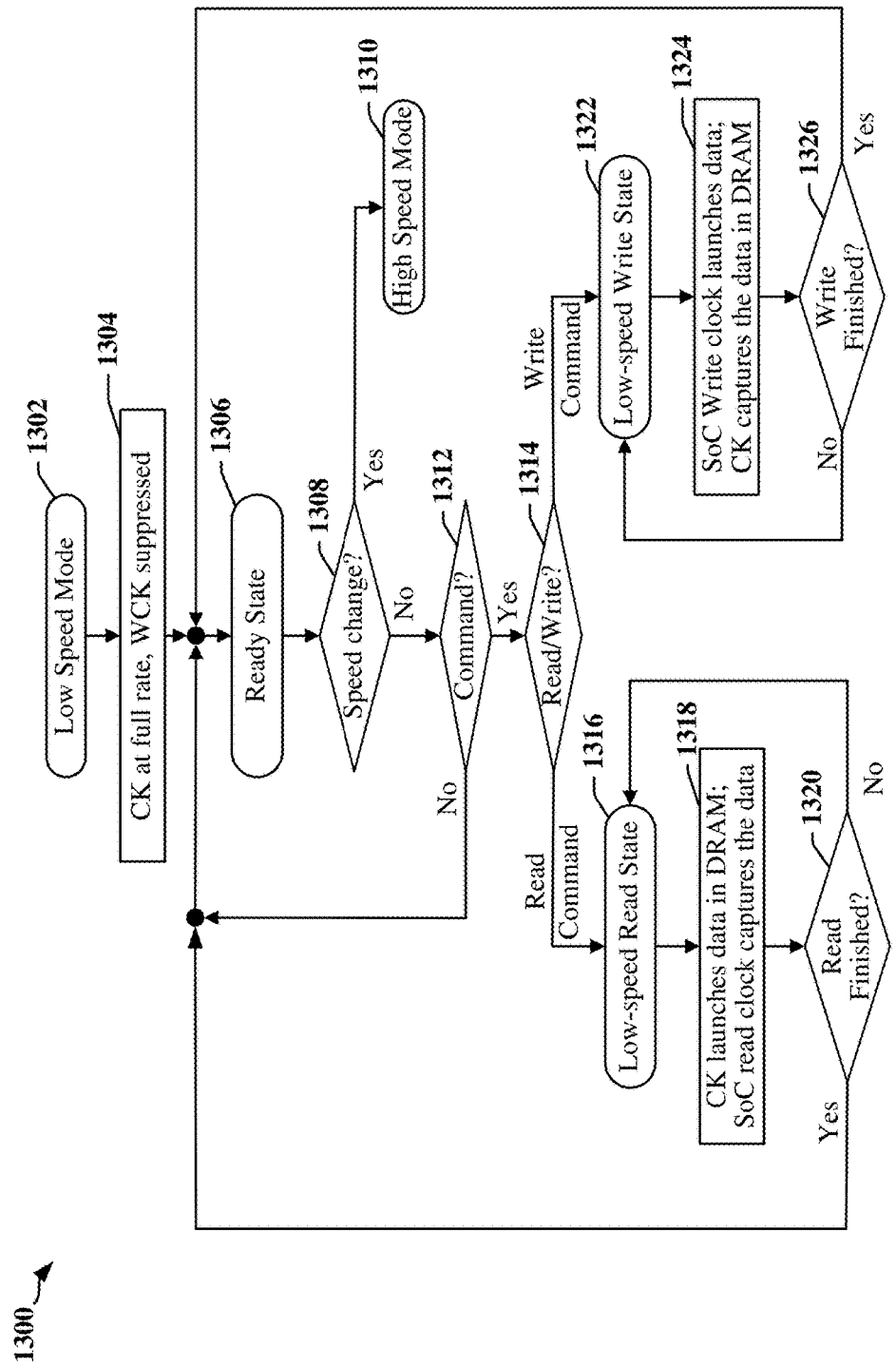
FIG. 13 is a flow chart of a method for operating an adaptive communication interface in a low-power mode in accordance with certain aspects disclosed herein.

FIG. 13 is a flow chart of a method for operating the adaptive communication interface 600 in a low-power mode in accordance with certain aspects disclosed herein. The communication interface 600 may be configured for low-speed operation after being placed in a low-power mode at block 1302.

At block 1304, the CK clock signal 642a may be set to full rate and the WCK signal 646a may be gated or otherwise suppressed.

At block 1306, the communication interface 600 may be placed in a ready state. In the ready state, the communication interface 600 may be responsive to read commands, write commands and/or mode of operation commands or control signals.

At block 1308, the communication interface 600 may determine whether a change in mode of operation is indicated. If a change is indicated, the communication interface 600 may enter a high-speed mode at block 1310. Otherwise, the communication interface 600 may proceed to block 1312.

At block 1312, the communication interface 600 may determine whether a command has been received. If not, then the communication interface 600 may continue the ready state at block 1306. If a command has been received, the communication interface 600 may determine at block 1314 whether the command is a read command or write command. For a read command, the process continues at block 1316. For a write command, the process may continue at block 1322. The decision blocks 1308, 1312, 1314 may be performed in a polled manner, as depicted. In some instances, the communication interface 600 may receive interrupts or other signals that cause it to determine a type of command that has been received. Accordingly, each decision block 1308, 1312, 1314 may be entered independently and/or asynchronously.

When a read command has been received, the communication interface 600 may enter a low-speed read state at block 1316. In this mode, and as depicted in block 1318, the CK signal 642b is used to launch data from the DRAM, and the sampling clock signal 638 generated by the CDR circuit 608 is used to capture the data at the SoC. The communication interface 600 may perform reads repetitively until it is determined at block 1320 that the read command has been completed or otherwise terminated. Upon completion of the read command, the communication interface 600 may return to the ready state at block 1306.

When a write command has been received, the communication interface 600 may enter a low-speed write state at block 1322. In this mode, and as depicted in block 1324, the SoC write clock signal 672 is used to launch data from the SoC, and the CK signal 642b is used to capture the data at the DRAM. The communication interface 600 may perform writes repetitively until it is determined at block 1326 that the write command has been completed or otherwise terminated. Upon completion of the write command, the communication interface 600 may return to the ready state at block 1306.

Figure 14:
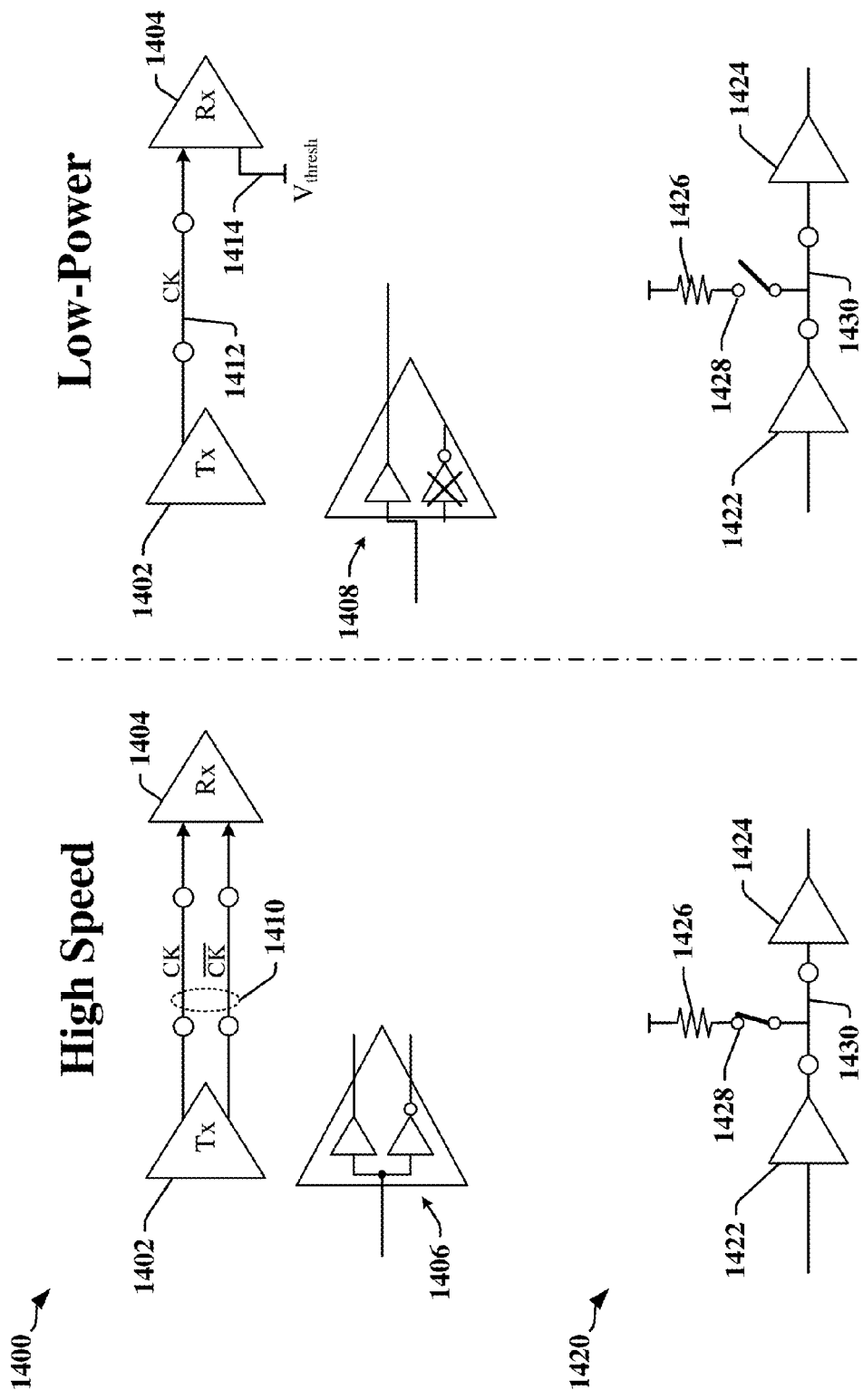
FIG. 14 illustrates device configurations for high-speed and low-power modes of communication in accordance with certain aspects disclosed herein.

FIG. 14 illustrates certain circuits, devices and/or components that may be configured according to a mode of operation of an adaptable, multi-clock rate communication interface. In one example 1400, a differential lane of the communication interface used for transmitting a clock signal may be reconfigured to provide a single-ended lane when the frequency of the clock is reduced. A configurable driver 1402 may be operated as a differential line driver (illustrated conceptually at 1406) in certain modes of operation, and may transmit a clock signal to a configurable receiver 1404 over two wires 1410. The configurable driver 1402 may be reconfigured to operate as a single-ended driver (illustrated conceptually at 1408) when the frequency of the clock signal is reduced, and may transmit the clock signal over a single wire 1412 The configurable receiver 1404 may be reconfigured to operate as a single-ended receiver by causing the configurable receiver 1404 to compare a single ended signal received from the single wire 1412 to a threshold value 1414.

In another example, one or more line terminators 1426 may be selectively coupled to a transmission line or wire 1430 based on a mode of operation. A switch 1428 may be provided to selectively couple each line terminator 1426 to the transmission line or wire 1430. The line terminator 1426 may be provided in a line driver 1422, a line receiver 1424, and/or another device or circuit coupled to the transmission line or wire 1430. In one example, the switch 1428 may be operated by controlling a voltage applied to a gate of a transistor coupling the line terminator 1426 to the transmission line or wire 1430, where the voltage applied to the gate determines whether the transistor is turned on and the line terminator 1426 is coupled to the transmission line or wire 1430, or turned off and the line terminator 1426 is decoupled from the transmission line or wire 1430.

Descriptions of Certain Processing Systems and Methods

An integrated circuit device, SoC, or other device may include a memory interface controller adapted according to certain aspects disclosed herein. The memory interface controller may be implemented using one or more processing circuits, and/or may be configured and controlled using one or more processing circuits. In some instances memory interface controller may be provided as a standalone device.

Figure 15:
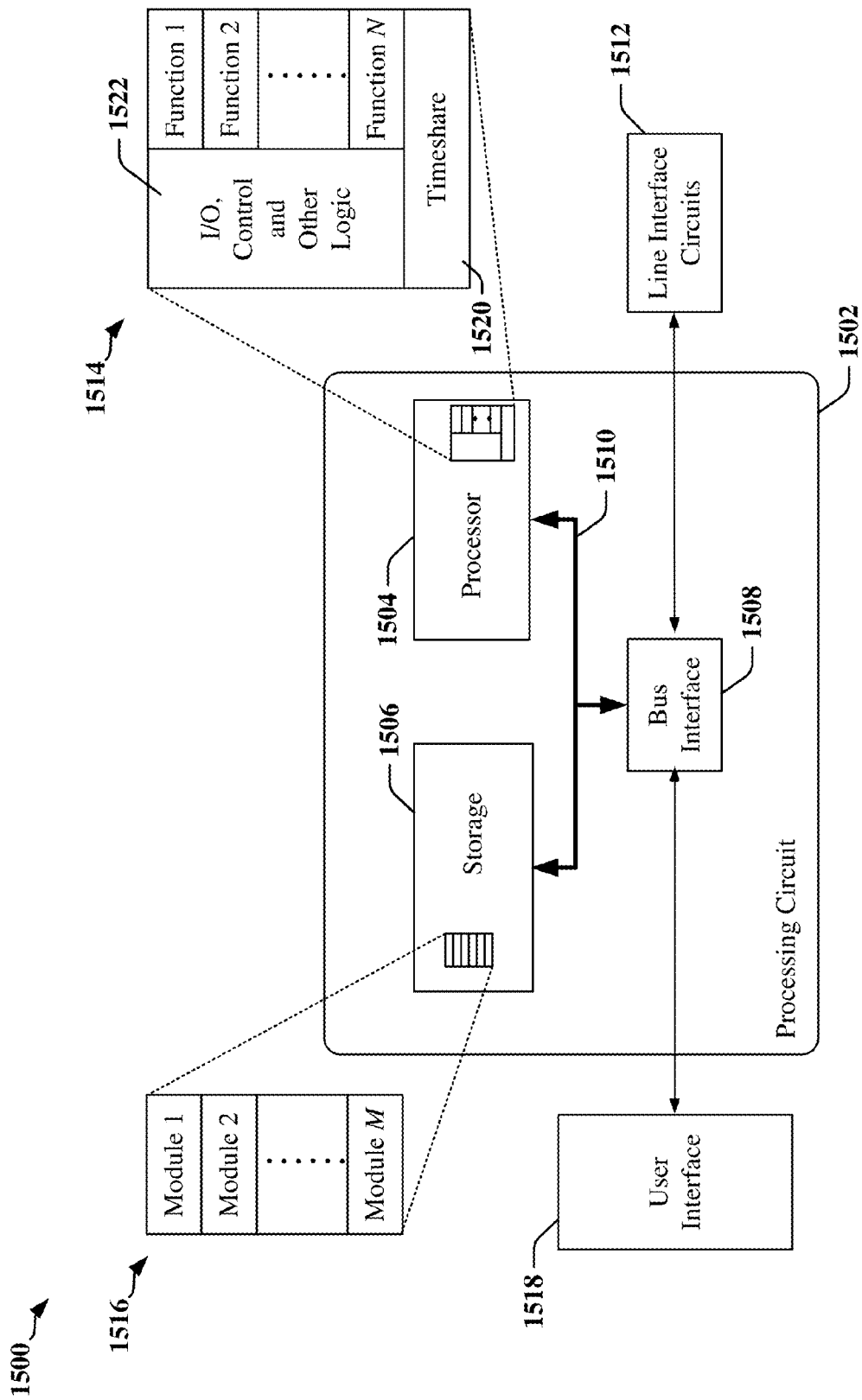
FIG. 15 is a block diagram illustrating an example of an apparatus employing a processing circuit that may be adapted according to certain aspects disclosed herein.

FIG. 15 is a conceptual diagram 1500 illustrating a simplified example of a hardware implementation for an apparatus employing a processing circuit 1502 that may be configured to perform one or more functions disclosed herein. In accordance with various aspects of the disclosure, an element, or any portion of an element, or any combination of elements as disclosed herein may be implemented using the processing circuit 1502. The processing circuit 1502 may include one or more processors 1504 that are controlled by some combination of hardware and software modules. Hardware modules may include one or more analog or digital circuits that may perform some combination of logic functions and signal processing. Software modules may include blocks of code that may be used to configure and/or control operations of a processor 1504 in the performance of one or more functions. Examples of processors 1504 include microprocessors, microcontrollers, digital signal processors (DSPs), field programmable gate arrays (FPGAs), programmable logic devices (PLDs), state machines, sequencers, gated logic, discrete hardware circuits, and other suitable hardware configured to perform the various functionality described throughout this disclosure. The one or more processors 1504 may include specialized processors that perform specific functions, and that may be configured, augmented or controlled by one of the software modules 1516. The one or more processors 1504 may be configured through a combination of software modules 1516 loaded during initialization, and further configured by loading or unloading one or more software modules 1516 during operation.

In the illustrated example, the processing circuit 1502 may be implemented with a bus architecture, represented generally by the bus 1510. The bus 1510 may include any number of interconnecting buses and bridges depending on the specific application of the processing circuit 1502 and the overall design constraints. The bus 1510 links together various circuits including the one or more processors 1504, and storage 1506. Storage 1506 may include memory devices and mass storage devices, and may be referred to herein as computer-readable media and/or processor-readable media. The bus 1510 may also link various other circuits such as timing sources, timers, peripherals, voltage regulators, and power management circuits. A bus interface 1508 may provide an interface between the bus 1510 and one or more transceivers 1512. A transceiver 1512 may be provided for each networking technology supported by the processing circuit, in some instances, multiple networking technologies may share some or all of the circuitry or processing modules found in a transceiver 1512. Each transceiver 1512 provides a means for communicating with various other apparatus over a transmission medium. Depending upon the nature of the apparatus, a user interface 1518 (e.g., keypad, display, speaker, microphone, joystick) may also be provided, and may be communicatively coupled to the bus 1510 directly or through the bus interface 1508.

A processor 1504 may be responsible for managing the bus 1510 and for general processing that may include the execution of software stored in a computer-readable medium that may include the storage 1506. In this respect, the processing circuit 1502, including the processor 1504, may be used to implement any of the methods, functions and techniques disclosed herein. The storage 1506 may be used for storing data that is manipulated by the processor 1504 when executing software, and the software may be configured to implement any one of the methods disclosed herein.

One or more processors 1504 in the processing circuit 1502 may execute software. Software shall be construed broadly to mean instructions, instruction sets, code, code segments, program code, programs, subprograms, software modules, applications, software applications, software packages, routines, subroutines, objects, executables, threads of execution, procedures, functions, algorithms, etc., whether referred to as software, firmware, middleware, microcode, hardware description language, or otherwise. The software may reside in computer-readable form in the storage 1506 or in an external computer readable medium. The external computer-readable medium and/or storage 1506 may include a non-transitory computer-readable medium. A non-transitory computer-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a "flash drive," a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer. The computer-readable medium and/or storage 1506 may also include, by way of example, a carrier wave, a transmission line, and any other suitable medium for transmitting software and/or instructions that may be accessed and read by a computer. Computer-readable medium and/or the storage 1506 may reside in the processing circuit 1502, in the processor 1504, external to the processing circuit 1502, or be distributed across multiple entities including the processing circuit 1502. The computer-readable medium and/or storage 1506 may be embodied in a computer program product. By way of example, a computer program product may include a computer-readable medium in packaging materials. Those skilled in the art will recognize how best to implement the described functionality presented throughout this disclosure depending on the particular application and the overall design constraints imposed on the overall system.

The storage 1506 may maintain software maintained and/or organized in loadable code segments, modules, applications, programs, etc., which may be referred to herein as software modules 1516. Each of the software modules 1516 may include instructions and data that, when installed or loaded on the processing circuit 1502 and executed by the one or more processors 1504, contribute to a run-time image 1514 that controls the operation of the one or more processors 1504. When executed, certain instructions may cause the processing circuit 1502 to perform functions in accordance with certain methods, algorithms and processes described herein.

Some of the software modules 1516 may be loaded during initialization of the processing circuit 1502, and these software modules 1516 may configure the processing circuit 1502 to enable performance of the various functions disclosed herein. For example, some software modules 1516 may configure internal devices and/or logic circuits 1522 of the processor 1504, and may manage access to external devices such as the transceiver 1512, the bus interface 1508, the user interface 1518, timers, mathematical coprocessors, and so on. The software modules 1516 may include a control program and/or an operating system that interacts with interrupt handlers and device drivers, and that controls access to various resources provided by the processing circuit 1502. The resources may include memory, processing time, access to the transceiver 1512, the user interface 1518, and so on.

One or more processors 1504 of the processing circuit 1502 may be multifunctional, whereby some of the software modules 1516 are loaded and configured to perform different functions or different instances of the same function. The one or more processors 1504 may additionally be adapted to manage background tasks initiated in response to inputs from the user interface 1518, the transceiver 1512, and device drivers, for example. To support the performance of multiple functions, the one or more processors 1504 may be configured to provide a multitasking environment, whereby each of a plurality of functions is implemented as a set of tasks serviced by the one or more processors 1504 as needed or desired. In one example, the multitasking environment may be implemented using a timesharing program 1520 that passes control of a processor 1504 between different tasks, whereby each task returns control of the one or more processors 1504 to the timesharing program 1520 upon completion of any outstanding operations and/or in response to an input such as an interrupt. When a task has control of the one or more processors 1504, the processing circuit is effectively specialized for the purposes addressed by the function associated with the controlling task. The timesharing program 1520 may include an operating system, a main loop that transfers control on a round-robin basis, a function that allocates control of the one or more processors 1504 in accordance with a prioritization of the functions, and/or an interrupt driven main loop that responds to external events by providing control of the one or more processors 1504 to a handling function.

Figure 16:
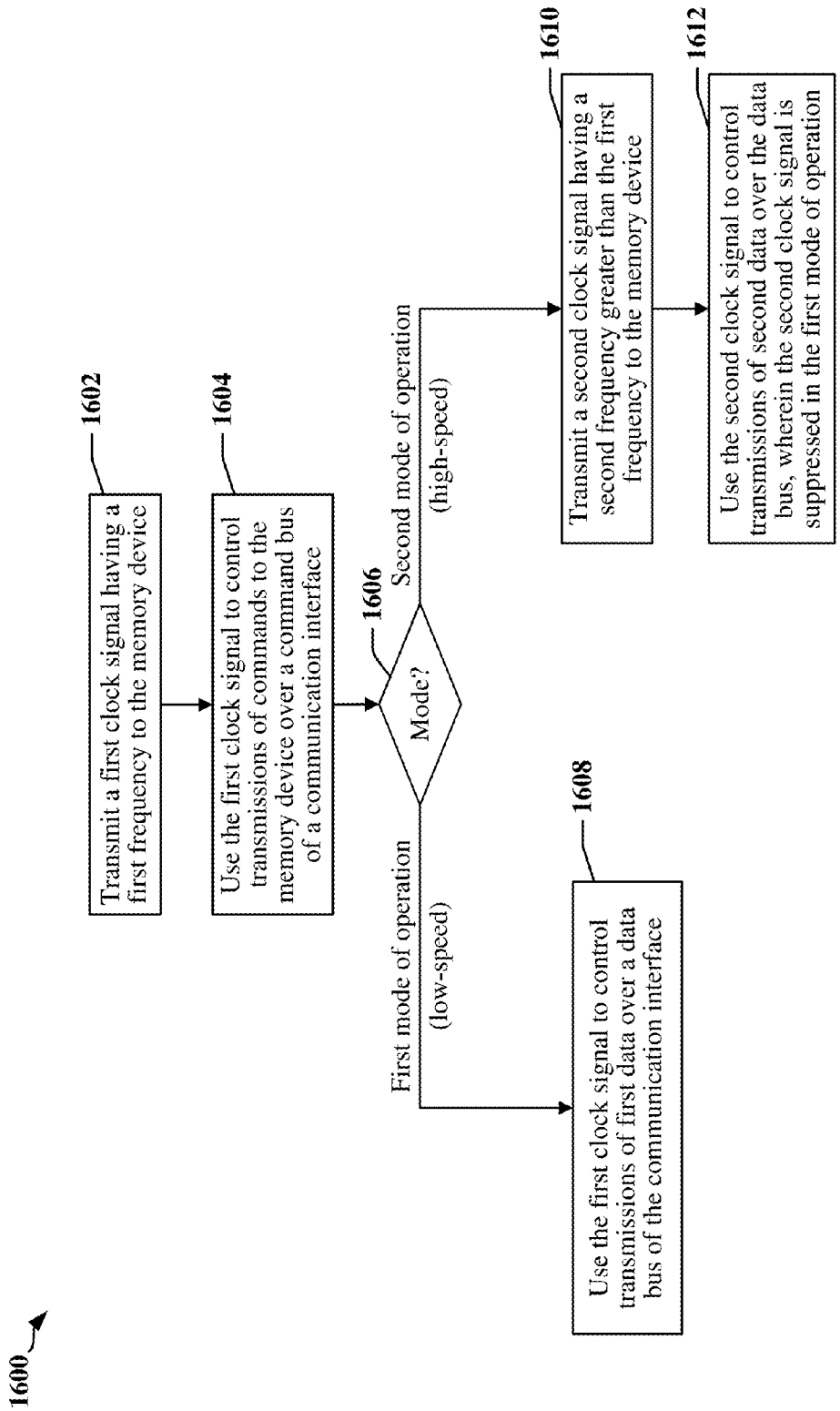
FIG. 16 is a flow chart illustrating a generalized method for operating a controller in an adaptive communication interface in accordance with certain aspects disclosed herein.

FIG. 16 illustrates a method for operating a controller used to control memory read and write operations in accordance with certain aspects disclosed herein.

At block 1602, a first clock signal having a first frequency may be transmitted to the memory device.

At block 1604, the first clock signal may be used to control transmissions of commands to the memory device over a command bus of the communication interface.

At block 1606, a mode of operation of the communication interface may be determined. If the mode of operation is determined to be a first, low-power mode of operation, the method continues at block 1608. If the mode of operation is determined to be a second, high-speed mode of operation, the method continues at block 1610.

At block 1608, the communication interface is operated in the first mode of operation and the first clock signal is used to control transmissions of first data over a data bus of the communication interface.

At block 1610, the communication interface is operated in the second mode of operation and a second clock signal having a second frequency greater than the first frequency is transmitted to the memory device.

At block 1612, the second clock signal may be used to control transmissions of second data over the data bus.

In some examples, the second clock signal is suppressed in the first mode of operation. The first and second clock signals may be provided by the memory controller. The first data may be transmitted by the memory controller to the memory device, or transmitted by the memory device to the memory controller. The second data may be transmitted by the memory controller to the memory device, or transmitted by the memory device to the memory controller.

In some instances, the memory controller is embodied in an applications processor. The memory controller may be embodied in an SoC device.

In one example, a low-speed clock signal may be generated. The low-speed clock signal may be phase-shifted based on training information to obtain the first clock signal.

In some instances, a high-speed clock signal may be generated in the second mode of operation. A first delay may be applied to the high-speed clock signal to obtain a high-speed read clock signal. The first delay may be configured based on training information. A second delay may be applied to the high-speed clock signal to obtain a high-speed write clock signal. The second delay may be configured based on the training information. The high-speed read clock signal may be selected for transmission to the memory device as the second clock signal during memory read operations in the second mode of operation. The high-speed write clock signal may be selected for transmission to the memory device as the second clock signal during memory write operations in the second mode of operation.

In some examples, the memory controller includes a CDR circuit that provides a sampling clock based in part on transitions of signaling state on the data bus. The memory device may include logic configured to provide transitions in signaling state on the data bus when two or more bytes of data read from the memory device are identical.

The second frequency may be at least double the first frequency, in some instances, the first frequency is no more than a quarter of the second frequency.

Figure 17:
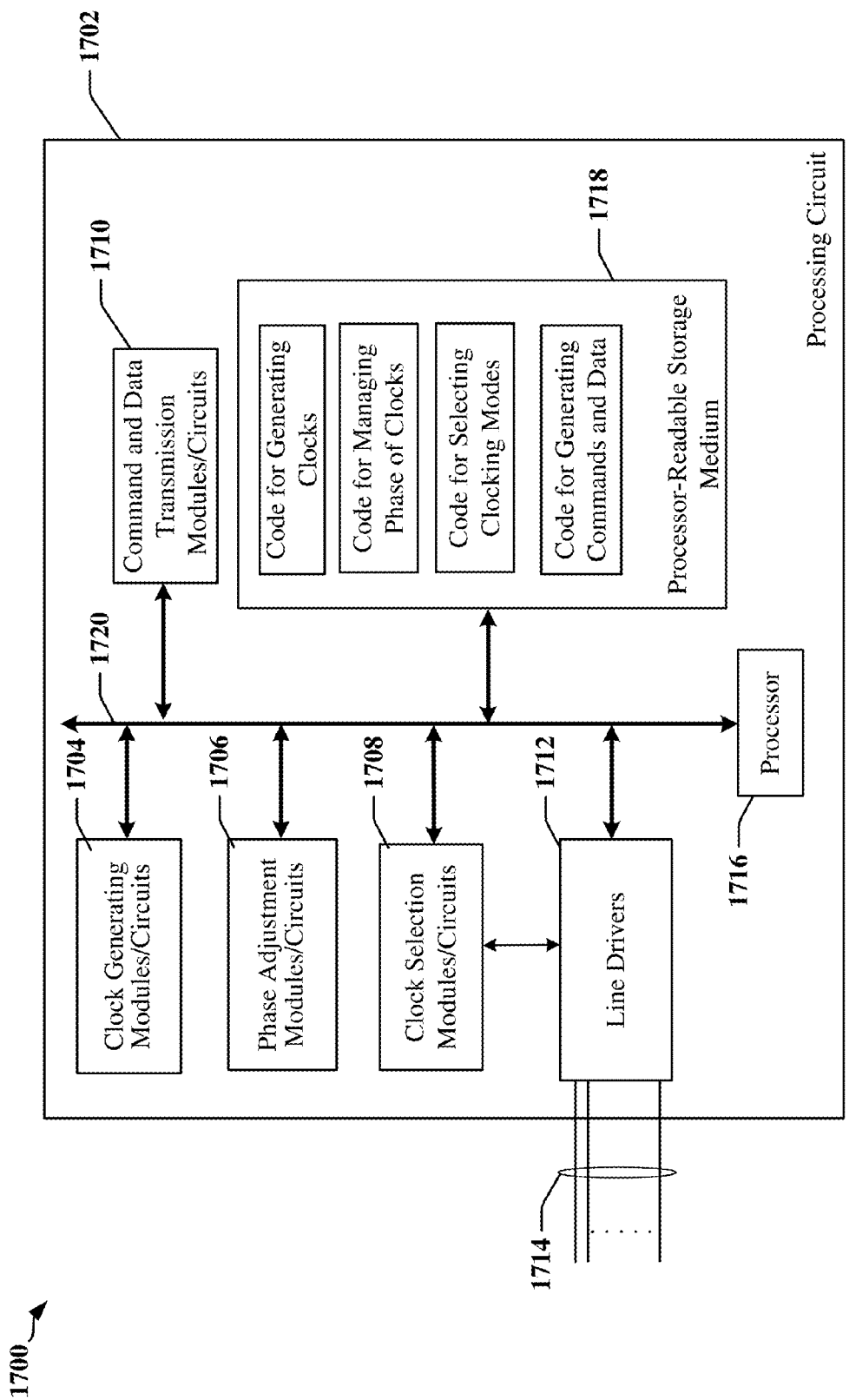
FIG. 17 is a diagram illustrating a first example of a hardware implementation for an apparatus employing a processing employing a processing circuit adapted according to certain aspects disclosed herein.

FIG. 17 is a diagram illustrating a simplified example of a hardware implementation for a memory controller apparatus 1700 that includes, or is coupled to a processing circuit 1702. The processing circuit typically has a processor 1716 that may include one or more of a microprocessor, microcontroller, digital signal processor, a sequencer and a state machine. The processing circuit 1702 may be implemented with a bus architecture, represented generally by the bus 1720. The bus 1720 may include any number of interconnecting buses and bridges depending on the specific application of the processing circuit 1702 and the overall design constraints. The bus 1720 links together various circuits including one or more processors and/or hardware modules, represented by the processor 1716, the modules or circuits 1704, 1706, 1708 and 1710, line driver circuits 1712 configurable to communicate over a memory bus 1714 that includes a plurality of connectors or wires, and the computer-readable storage medium 1718. The bus 1720 may also link various other circuits such as timing sources, peripherals, voltage regulators, and power management circuits, which are well known in the art, and therefore, will not be described any further.

The processor 1716 is responsible for general processing, including the execution of software stored on the computer-readable storage medium 1718. The software, when executed by the processor 1716, causes the processing circuit 1702 to perform the various functions described supra for any particular apparatus. The computer-readable storage medium 1718 may also be used for storing data that is manipulated by the processor 1716 when executing software, including data decoded from symbols transmitted over the memory bus 1714. The processing circuit 1702 further includes at least one of the modules 1704, 1706, 1708 and 1710. The modules 1704, 1706, 1708 and 1710 may be software modules running in the processor 1716, resident/stored in the computer-readable storage medium 1718, one or more hardware modules coupled to the processor 1716, or some combination thereof. The modules 1704, 1706, 1708 and 1710 may include microcontroller instructions, state machine configuration parameters, or some combination thereof.

In one configuration, the apparatus 1700 includes a module and/or circuit 1704 that is configured to generate one or more clocks, a module and/or circuit 1706 that is configured to adjust the phase relationship between the one or more clocks and data or command transmitted on a communication interface, a module and/or circuit 1708 that is configured to select between the phase-shifted clocks for transmission as a data clock and/or command clock, and modules and/or circuits 1710 configured to provide data and commands for transmission on the communication interface.

Figure 18:
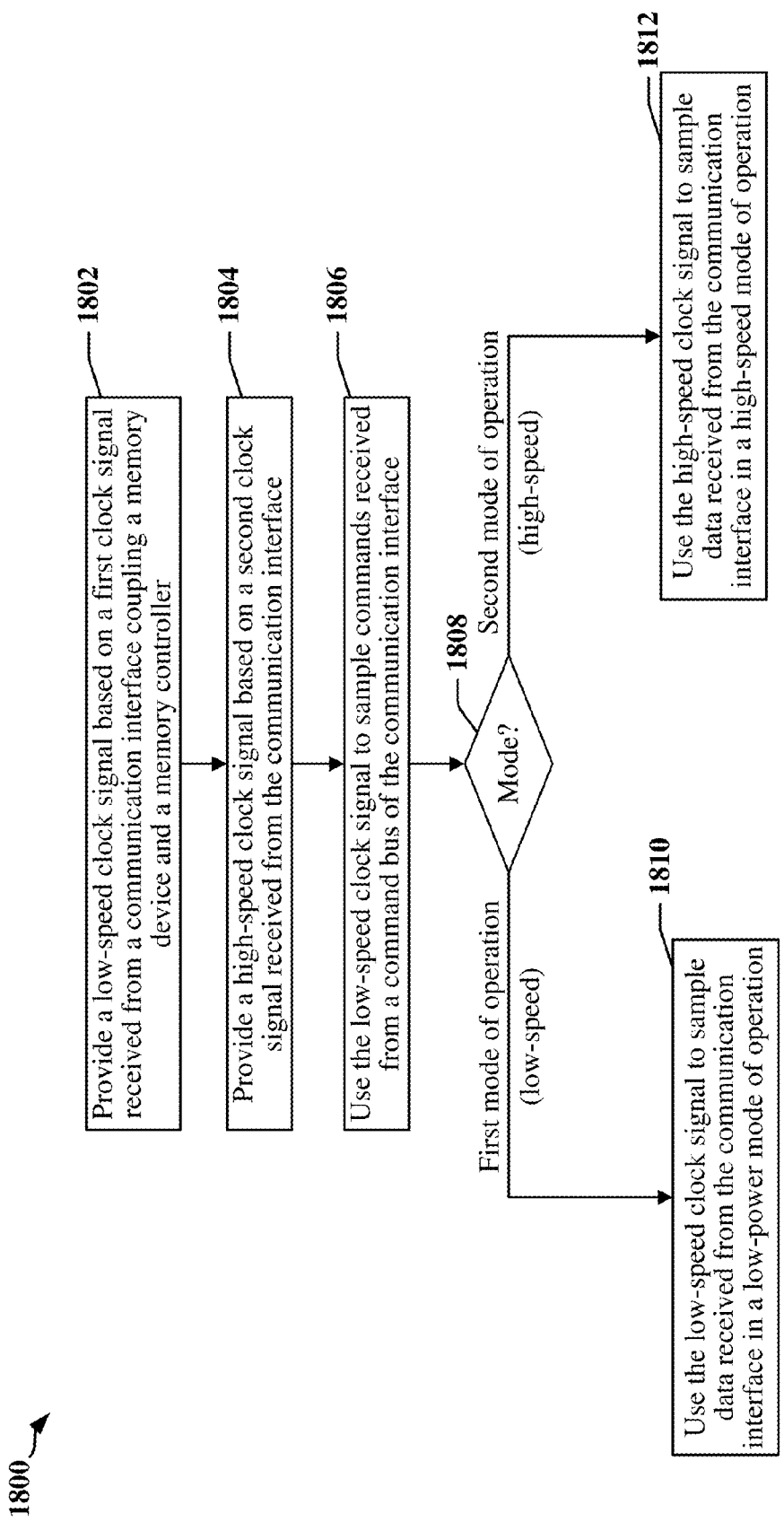
FIG. 18 is a flow chart illustrating a method for operating for operating a memory device in an adaptive communication interface in accordance with certain aspects disclosed herein.

FIG. 18 illustrates a method operable in accordance with certain aspects disclosed herein at a bus interface of a memory device or memory system.

At block 1802, the memory device may provide a low-speed clock signal based on a first clock signal received from a communication interface coupling a memory device and a memory controller.

At block 1804, the memory device may provide a high-speed clock signal based on a second clock signal received from the communication interface. The second clock signal may have a frequency that is at least double the frequency of the first clock signal.

At block 1806, the memory device may use the low-speed clock signal to sample commands received from a command bus of the communication interface.

At block 1808, a mode of operation of the communication interface may be determined. If the mode of operation is determined to be a first, low-power mode of operation, the method continues at block 1810. If the mode of operation is determined to be a high-speed mode of operation, the method continues at block 1812.

At block 1810, the communication interface is operated in the first mode of operation and the memory device may use the low-speed clock signal to sample data received from the communication interface in a low-power mode of operation.

At block 1812, the communication interface is operated in the second mode of operation and the memory device may use the high-speed clock signal to sample data received from the communication interface in a high-speed mode of operation.

In one example, the memory device may configure a first phase shifting circuit using first training information received from the communication interface, and configure a second phase shifting circuit using second training information received from the communication interface. The first phase shifting circuit may provide the low-speed clock signal. The second phase shifting circuit may provide the high-speed clock signal.

In some instances, receivers associated with providing the second clock signal are disabled in the low-power mode of operation.

In another example, the memory device may configure one or more receivers to operate as differential receivers in the high-speed mode of operation, and configure the one or more receivers to operate as single-ended receivers in the low-power mode of operation.

Figure 19:
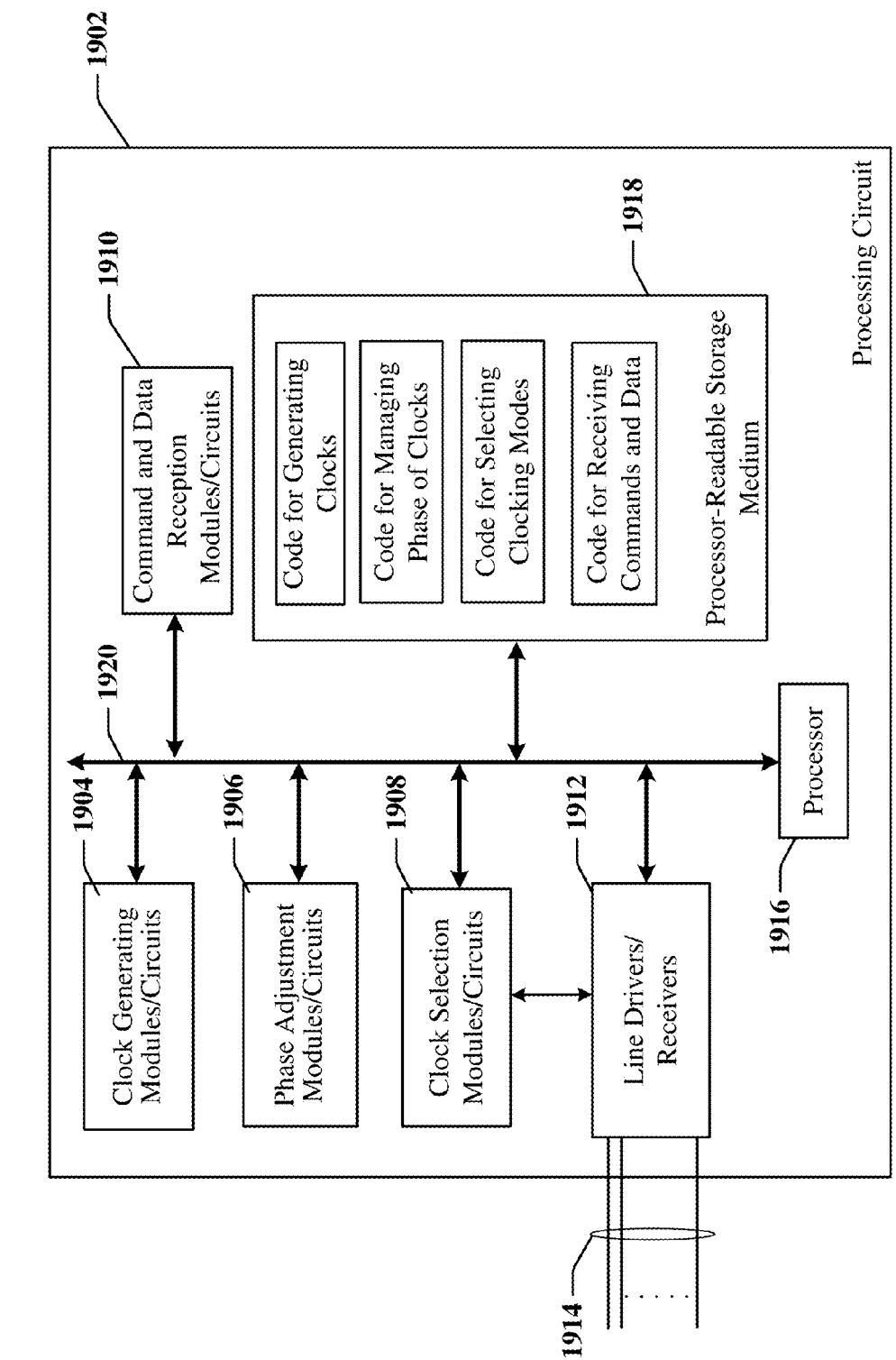
FIG. 19 is a diagram illustrating a second example of a hardware implementation for an apparatus employing a processing employing a processing circuit adapted according to certain aspects disclosed herein.

FIG. 19 is a diagram illustrating a simplified example of a hardware implementation for a memory interface apparatus 1900 that employs a processing circuit 1902. The processing circuit typically has a processor 1916 that may include one or more of a microprocessor, microcontroller, digital signal processor, a sequencer and a state machine. The processing circuit 1902 may be implemented with a bus architecture, represented generally by the bus 1920. The bus 1920 may include any number of interconnecting buses and bridges depending on the specific application of the processing circuit 1902 and the overall design constraints. The bus 1920 links together various circuits including one or more processors and/or hardware modules, represented by the processor 1916, the modules or circuits 1904, 1906, 1908 and 1910, line driver circuits 1912 configurable to communicate over a memory bus 1914 that includes a plurality of connectors or wires, and the computer-readable storage medium 1918. The bus 1920 may also link various other circuits such as timing sources, peripherals, voltage regulators, and power management circuits, which are well known in the art, and therefore, will not be described any further.

The processor 1916 is responsible for general processing, including the execution of software stored on the computer-readable storage medium 1918. The software, when executed by the processor 1916, causes the processing circuit 1902 to perform the various functions described supra for any particular apparatus. The computer-readable storage medium 1918 may also be used for storing data that is manipulated by the processor 1916 when executing software, including data decoded from symbols transmitted over the memory bus 1914. The processing circuit 1902 further includes at least one of the modules 1904, 1906, 1908 and 1910. The modules 1904, 1906, 1908 and 1910 may be software modules running in the processor 1916, resident/stored in the computer-readable storage medium 1918, one or more hardware modules coupled to the processor 1916, or some combination thereof. The modules 1904, 1906, 1908 and 1910 may include microcontroller instructions, state machine configuration parameters, or some combination thereof.

In one configuration, the apparatus 1900 includes a module and/or circuit 1904 that is configured to generate one or more clocks, a module and/or circuit 1906 that is configured to adjust the phase relationship between the one or more clocks, data or commands received from the communication interface, a module and/or circuit 1908 that is configured to select between the phase-shifted clocks for transmission as a data clock and/or command clock, and modules and/or circuits 1910 configured to receive and decode data and commands from the communication interface.

In one example, the module and/or circuit 1904 that generates clocks may include a clock recovery circuit. The module and/or circuit 1906 that adjusts the phase relationship between clocks, data or commands may include a first phase shifting circuit configured by training information to provide a low-speed clock signal based on a first clock signal received from the communication interface, and a second phase shifting circuit configured by training information to provide a high-speed clock signal based on a second clock signal received from the communication interface. Selection logic may be configured to select between the low-speed clock signal and the high-speed clock signal to provide a data clocking signal. The selection logic may include multiplexers, de-multiplexers, combinational logic, mapping logic, or the like. The low-speed clock signal may be used to sample commands received from a command bus of the communication interface. When memory is read, the high-speed clock signal may be selected as a data clocking signal in a high-speed mode of operation, and the low-speed clock signal may be selected as the data clocking signal in a low-power mode of operation. When memory is written, the high-speed clock signal may be selected as a data sampling signal in a high-speed mode of operation, and the low-speed clock signal may be selected as the data sampling signal in a low-power mode of operation.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the fill scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. A method for operating a communication interface coupling a memory device and a memory controller, comprising:
   transmitting a first clock signal having a first frequency to the memory device;
   using the first clock signal to control transmissions of commands to the memory device over a command bus of the communication interface;
   using the first clock signal to control transmissions of first data over a data bus of the communication interface in a first mode of operation; and
   in a second mode of operation,
       transmitting a second clock signal having a second frequency greater than the first frequency to the memory device, and
       using the second clock signal to control transmissions of second data over the data bus,
   wherein the second clock signal is suppressed in the first mode of operation.

2. The method of claim 1, wherein the first clock signal is provided by the memory controller and is used to control transmissions of commands to the memory device over the command bus in the first mode of operation and in the second mode of operation, and wherein the second clock signal is provided by the memory controller.

3. The method of claim 1, wherein the first data is transmitted by the memory controller to the memory device.

4. The method of claim 1, wherein the first data is transmitted by the memory device to the memory controller.

5. The method of claim 1, wherein the memory controller is embodied in an applications processor.

6. The method of claim 1, wherein the memory controller is embodied in a system on chip (SoC) device.

7. The method of claim 1, further comprising:
generating a low-speed clock signal; and
phase-shifting the low-speed clock signal based on training information to obtain the first clock signal.

8. The method of claim 1, further comprising:
generating a high-speed clock signal in the second mode of operation;
applying a first delay to the high-speed clock signal to obtain a high-speed read clock signal, wherein the first delay is configured based on training information;
applying a second delay to the high-speed clock signal to obtain a high-speed write clock signal, wherein the second delay is configured based on the training information;
selecting the high-speed read clock signal for transmission to the memory device as the second clock signal during memory read operations in the second mode of operation; and
selecting the high-speed write clock signal for transmission to the memory device as the second clock signal during memory write operations in the second mode of operation.

9. The method of claim 1, wherein the memory controller includes a clock and data recovery (CDR) circuit that provides a sampling clock based in part on transitions of signaling state on the data bus.

10. The method of claim 9, wherein the memory device includes logic configured to provide transitions in signaling state on the data bus when two or more bytes of data read from the memory device are identical.

11. The method of claim 1, wherein the second frequency is at least double the first frequency.

12. The method of claim 1, wherein the first frequency is no more than a quarter of the second frequency.

13. The method of claim 1, further comprising:
configuring one or more line drivers or receivers to operate as differential line drivers in the second mode of operation; and
configuring the one or more line drivers or receivers to operate as single-ended line drivers or receivers in the first mode of operation.

14. A memory controller comprising:
clock generation logic configured to provide a first clock signal having a first frequency and a second clock signal having a second frequency greater than the first frequency;
a first phase shifting circuit configured by training information to provide a first phase-shifted version of the second clock signal;
a second phase shifting circuit configured by the training information to provide a second phase-shifted version of the second clock signal; and
selection logic configured to provide a data clock signal to a memory device in a high-speed mode of operation, and to suppress the data clock signal in a low-power mode of operation,
wherein the first phase-shifted version of the second clock signal is provided by the selection logic during memory read operations, in the second phase-shifted version of the second clock signal is provided by the selection logic during memory write operations.

15. The memory controller of claim 14, further comprising:
one or more line drivers configured to transmit a command clock signal to the memory device, wherein the command clock signal is a phase-shifted version of the first clock signal, wherein the command clock signal is used to control transmissions of data to the memory device in the low-power mode of operation.

16. The memory controller of claim 14, further comprising:
a clock and data recovery (CDR) circuit that provides a sampling clock based in part on transitions of signaling state on a data bus of a communication interface,
wherein the memory device includes logic configured to provide transitions in signaling state on the data bus when two or more bytes of data read from the memory device are identical.

17. The memory controller of claim 14, wherein the second frequency is at least double the first frequency.

18. The memory controller of claim 14, wherein the first frequency is no more than a quarter of the second frequency.

19. The memory controller of claim 14, further comprising:
one or more line drivers configured to couple the memory controller to the memory device,
wherein the one or more line drivers operate as differential line drivers in the high-speed mode of operation and operate as single-ended line drivers in the low-power mode of operation.

20. A memory device comprising:
a first phase shifting circuit configured by training information to provide a low-speed clock signal based on a first clock signal received from a communication interface coupling a memory device and a memory controller;
a second phase shifting circuit configured by training information to provide a high-speed clock signal based on a second clock signal received from the communication interface; and
selection logic configured to select between the low-speed clock signal and the high-speed clock signal to provide a data clocking signal,
wherein the low-speed clock signal is used to sample commands received from a command bus of the communication interface in a high-speed mode of operation and in a low-power mode of operation,
wherein the high-speed clock signal is selected as the data clocking signal or as a data sampling signal in the high-speed mode of operation and suppressed in the low-power mode of operation,
wherein the low-speed clock signal is selected as the data clocking signal or the data sampling signal in the low-power mode of operation.

21. The memory device of claim 20, wherein receivers that provide the second clock signal are disabled in the low-power mode of operation.

22. The memory device of claim 20, further comprising:
logic configured to provide transitions in signaling state on a data bus of the communication interface when two or more bytes of data read from the memory device are identical,
wherein the memory controller is configured to provide a clock based in part on transitions of signaling state on the data bus.

23. The memory device of claim 20, wherein the second clock signal may have a frequency that is at least double the frequency of the first clock signal.

24. The memory device of claim 20, wherein the first clock signal has a frequency that is no more than a quarter of the frequency of the second clock signal.

25. The memory device of claim 20, further comprising:
one or more receivers configured to receive a signal from the communication interface,
wherein the one or more receivers operate as differential receivers in the high-speed mode of operation and operate as single-ended receivers in the low-power mode of operation.

26. A method implemented at memory device, comprising:
providing a low-speed clock signal based on a first clock signal received from a communication interface coupling a memory device and a memory controller;
providing a high-speed clock signal based on a second clock signal received from the communication interface;
using the low-speed clock signal to sample commands received from a command bus of the communication interface in a high-speed mode of operation and in a low-power mode of operation;
using the high-speed clock signal to sample data received from the communication interface in the high-speed mode of operation;
suppressing the high-speed clock signal in the low-power mode of operation; and
using the low-speed clock signal to sample data received from the communication interface in the low-power mode of operation.

27. The method of claim 26, further comprising:
configuring a first phase shifting circuit using first training information received from the communication interface, wherein the first phase shifting circuit provides the low-speed clock signal; and
configuring a second phase shifting circuit using second training information received from the communication interface, wherein the second phase shifting circuit provides the high-speed clock signal.

28. The method of claim 26, wherein one or more receivers that provide the second clock signal are disabled in the low-power mode of operation.

29. The method of claim 26, wherein the second clock signal may have a frequency that is at least double the frequency of the first clock signal.

30. The method of claim 26, further comprising:
configuring one or more receivers to operate as differential receivers in the high-speed mode of operation; and
configuring the one or more receivers to operate as single-ended receivers in the low-power mode of operation.

* * * * *